(12) United States Patent
Baek et al.

(10) Patent No.: US 10,242,973 B2
(45) Date of Patent: Mar. 26, 2019

(54) FAN-OUT-SEMICONDUCTOR PACKAGE MODULE

(71) Applicant: SAMSUNG ELECTRO-MECHANICS CO., LTD., Suwon-si, Gyeonggi-do (KR)

(72) Inventors: Yong Ho Baek, Suwon-si (KR); Joo Hwan Jung, Suwon-si (KR); Young Sik Hur, Suwon-si (KR); Jung Chul Gong, Suwon-si (KR); Han Kim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/882,440

(22) Filed: Jan. 29, 2018

(65) Prior Publication Data

US 2019/0013300 A1 Jan. 10, 2019

(30) Foreign Application Priority Data

Jul. 7, 2017 (KR) .................. 10-2017-0086350
Oct. 20, 2017 (KR) .................. 10-2017-0136769

(51) Int. Cl.
*H01L 23/495* (2006.01)
*H01L 23/498* (2006.01)
(Continued)

(52) U.S. Cl.
CPC .......... *H01L 25/16* (2013.01); *H01L 23/3128* (2013.01); *H01L 23/3135* (2013.01);
(Continued)

(58) Field of Classification Search
CPC . H01L 25/16; H01L 23/3128; H01L 23/3135; H01L 23/49827; H01L 23/49838; H01L 23/552; H01L 28/40
(Continued)

(56) References Cited

U.S. PATENT DOCUMENTS 8,208,268 B2 * 6/2012 Kajiki ................ H05K 1/144
257/774
8,890,628 B2 * 11/2014 Nair ..................... H01L 25/16
257/416

(Continued)

FOREIGN PATENT DOCUMENTS

KR 10-2013-0015450 A 2/2013

OTHER PUBLICATIONS

Office Action issued in corresponding Korean Patent Application No. 10-2017-0136769, dated Oct. 31, 2018.
(Continued)

*Primary Examiner* — Dao H Nguyen
(74) *Attorney, Agent, or Firm* — Morgan Lewis & Bockius LLP

(57) ABSTRACT

A fan-out semiconductor package module includes: a core member having a first through hole and a second through hole; a semiconductor chip disposed in the first through hole, and having an active surface and an inactive surface opposite the active surface, the active surface having a connection pad disposed thereon; at least one first passive component disposed in the second through hole; a first encapsulant encapsulating the core member encapsulating at least a portion of each of the core member and the at least one first passive component; a second encapsulant encapsulating at least a portion of the inactive surface of the semiconductor chip; and a connection member disposed on the core member, the active surface of the semiconductor chip, and the at
(Continued)

least one first passive component, and including a redistribution layer electrically connected to the connection pad and the at least one first passive component.

30 Claims, 24 Drawing Sheets

(51) Int. Cl.
*H01L 23/367* (2006.01)
*H05K 7/00* (2006.01)
*H05K 7/06* (2006.01)
*H01L 25/16* (2006.01)
*H01L 23/31* (2006.01)
*H01L 49/02* (2006.01)
*H01L 23/552* (2006.01)

(52) U.S. Cl.
CPC .. *H01L 23/49827* (2013.01); *H01L 23/49838* (2013.01); *H01L 23/552* (2013.01); *H01L 28/40* (2013.01)

(58) Field of Classification Search
USPC ............... 257/668, 698, 700, 723, 776, 778, 257/E25.012, E25.029, E25.03, E23.004, 257/E23.044, E23.063, E23.067, E23.079, 257/E23.178; 174/260, 261; 361/761, 361/763, 814; 438/125
See application file for complete search history.

(56) References Cited

U.S. PATENT DOCUMENTS

| | | | |
|---|---|---|---|
| 9,425,131 B2* | 8/2016 | Chen | H01L 23/49568 |
| 9,466,545 B1 | 10/2016 | Scanlan et al. | |
| 9,913,380 B2* | 3/2018 | Lai | H01L 23/5389 |
| 10,026,678 B1* | 7/2018 | Cho | H01L 23/49503 |
| 2005/0122698 A1* | 6/2005 | Ho | H01L 23/5389 |
| | | | 361/761 |
| 2006/0191711 A1* | 8/2006 | Cho | H01L 23/5389 |
| | | | 174/260 |
| 2008/0180919 A1 | 7/2008 | Lim | |
| 2015/0084206 A1 | 3/2015 | Lin | |
| 2016/0338202 A1 | 11/2016 | Park et al. | |

OTHER PUBLICATIONS

Taiwanese Office Action dated Jan. 22, 2019 issued in Taiwanese Patent Application No. 107103913 (with English translation).

* cited by examiner

FAN-OUT-SEMICONDUCTOR PACKAGE MODULE

CROSS-REFERENCE TO RELATED APPLICATIONS

This application claims the benefit of priority to Korean Patent Application No. 10-2017-0086350, filed on Jul. 7, 2017, and to Korean Patent Application No. 10-2017-0136769, filed on Oct. 20, 2017, with the Korean Intellectual Property Office, the entireties of which are incorporated herein by reference.

TECHNICAL FIELD

The present disclosure relates to a semiconductor package module modularized by mounting a semiconductor chip, together with a plurality of passive components, within a single package.

BACKGROUND

As the size of displays for mobile devices increases, it is required to increase battery capacity. Because the mounting areas of batteries have increased with increases in battery capacity, a reduction in the size of printed circuit boards (PCBs) is required. A resulting decrease in the mounting area of components may cause interest in modularization to continue to rise.

Meanwhile, one example of a conventional technique for mounting a plurality of components is a chip on board (COB) technique. COB is a method of mounting an individual passive element and a semiconductor package on a PCB, using surface-mount technology (SMT). This method may be advantageous in terms of cost, but may require a wide mounting area due to the requirement of the minimum spacing retained between components, cause a significant increase in electromagnetic interference (EMI) between components, and lead to increased electrical noise due to a significantly long distance between semiconductor chips and passive components.

SUMMARY

An aspect of the present disclosure may provide a fan-out semiconductor package module having a novel structure, which may significantly reduce mounting areas of a semiconductor chip and a plurality of passive components, may significantly reduce a length of an electrical path between the semiconductor chip and the passive component, may nonetheless solve the problem of production yield, and may obtain an improved electromagnetic interference (EMI) shielding and heat dissipation effect using plating or the like.

One of various solutions, proposed in the present disclosure, is to mount a plurality of passive components and a semiconductor chip in a single package to form a module, and to encapsulate the passive components and the semiconductor chip in two steps in a packaging process. Further, an electromagnetic interference (EMI) shielding and heat dissipation effect may be obtained by applying plating or like to the package module having such a structure.

According to an aspect of the present disclosure, a fan-out semiconductor package module may include: a core member having a first through hole and a second through hole spaced from each other; a semiconductor chip disposed in the first through hole, the semiconductor chip having an active surface and an inactive surface opposite the active surface, the active surface having a connection pad disposed thereon; at least one first passive component disposed in the second through hole; a first encapsulant encapsulating the core member encapsulating at least a portion of each of the core member and the at least one first passive component, the first encapsulant filling at least a portion of the second through hole; a second encapsulant encapsulating at least a portion of the inactive surface of the semiconductor chip, the second encapsulant filling at least a portion of the first through hole; and a connection member disposed on the core member, the active surface of the semiconductor chip, and the at least one first passive component, the connection member including a redistribution layer electrically connected to the connection pad and the at least one first passive component.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
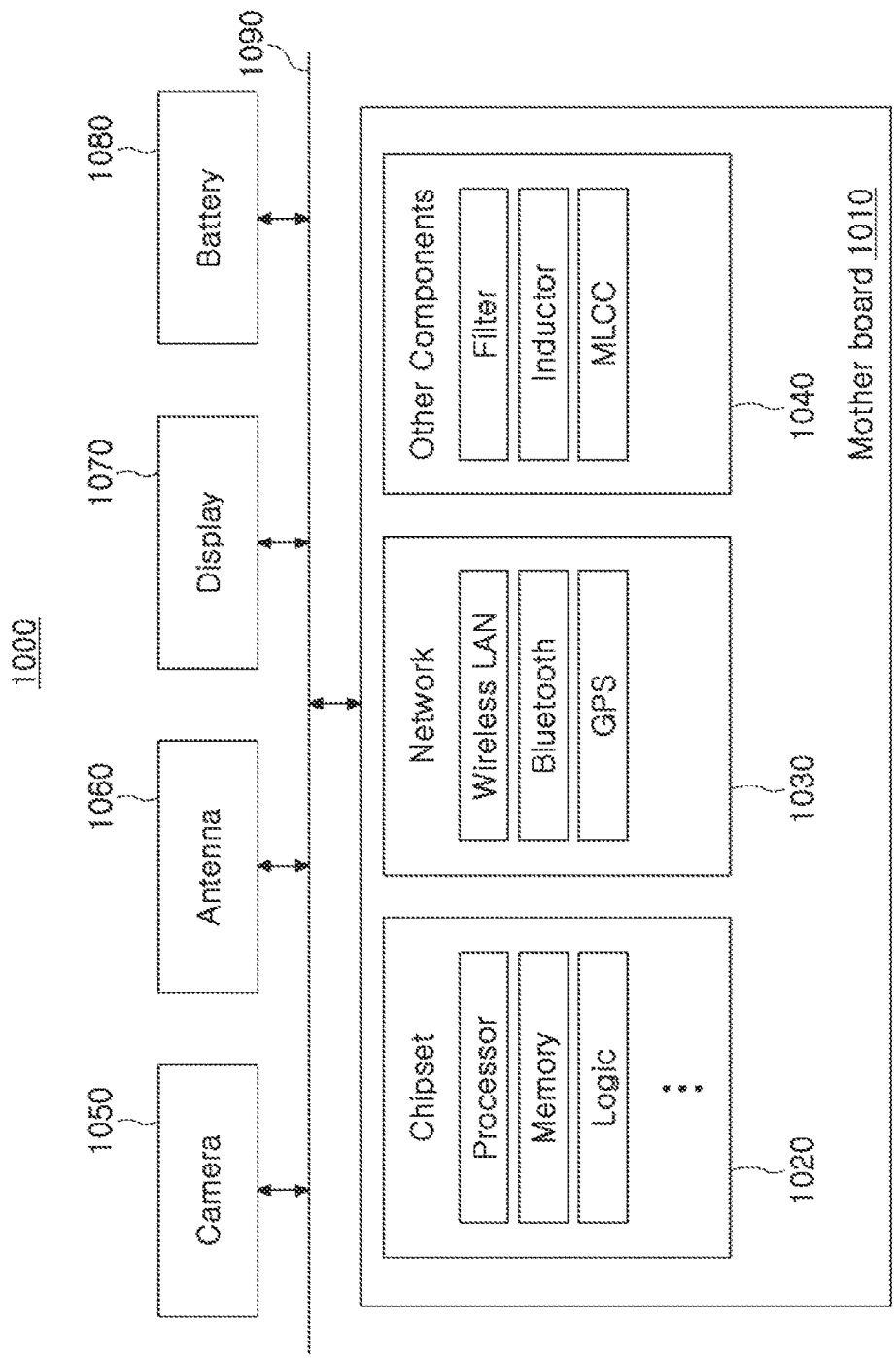
FIG. 1 is a schematic block diagram illustrating an example of an electronic device system.

Hereinafter, embodiments of the present disclosure will be described with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element, or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated, listed items.

It will be apparent that, although the terms 'first,' 'second,' 'third,' etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" or the like, may be used herein for ease of description to describe one element's relationship relative to another element(s), as shown in the figures. It will be understood that spatially relative terms are intended to encompass different orientations of the device in use or operation, in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations, depending on a particular directional orientation of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape resulting from manufacturing. The following embodiments may also be constituted alone or as a combination of several or all thereof.

The contents of the present disclosure described below may have a variety of configurations, and only a required configuration is proposed herein, but the present disclosure is not limited thereto.

Hereinafter, exemplary embodiments in the present disclosure will be described with reference to the attached drawings. The shape or size of components, shown in the drawings, is exaggerated for clarity.

Electronic Device

FIG. 1 is a schematic block diagram illustrating an example of an electronic device system.

Referring to FIG. 1, an electronic device 1000 may accommodate a motherboard 1010. The motherboard 1010 may include chip-related components 1020, network-related components 1030, other components 1040, and the like, connected physically and/or electrically thereto. These components may be connected to other components, to be described below, to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip-related components 1020 are not limited thereto, and may include other types of chip related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the above-mentioned protocols. However, the network-related components 1030 are not limited thereto, and may include a variety of other wireless or wired standards or protocols. In addition, the network-related components 1030 may be combined with each other, together with the chip-related components 1020 described above.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, and may include passive components used for various other purposes, or the like. In addition, the other components 1040 may be combined with each other, together with the chip-related components 1020 and/or the network-related components 1030.

Depending on a type of the electronic device 1000, the electronic device 1000 may include other components that may or may not be connected physically and/or electrically to the motherboard 1010. The other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, the other components are not limited thereto, and may also include other components used for various purposes, according to a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive component, or the like. However, the electronic device 1000 is not limited thereto, and may be any other electronic device able to process data.

Figure 2:
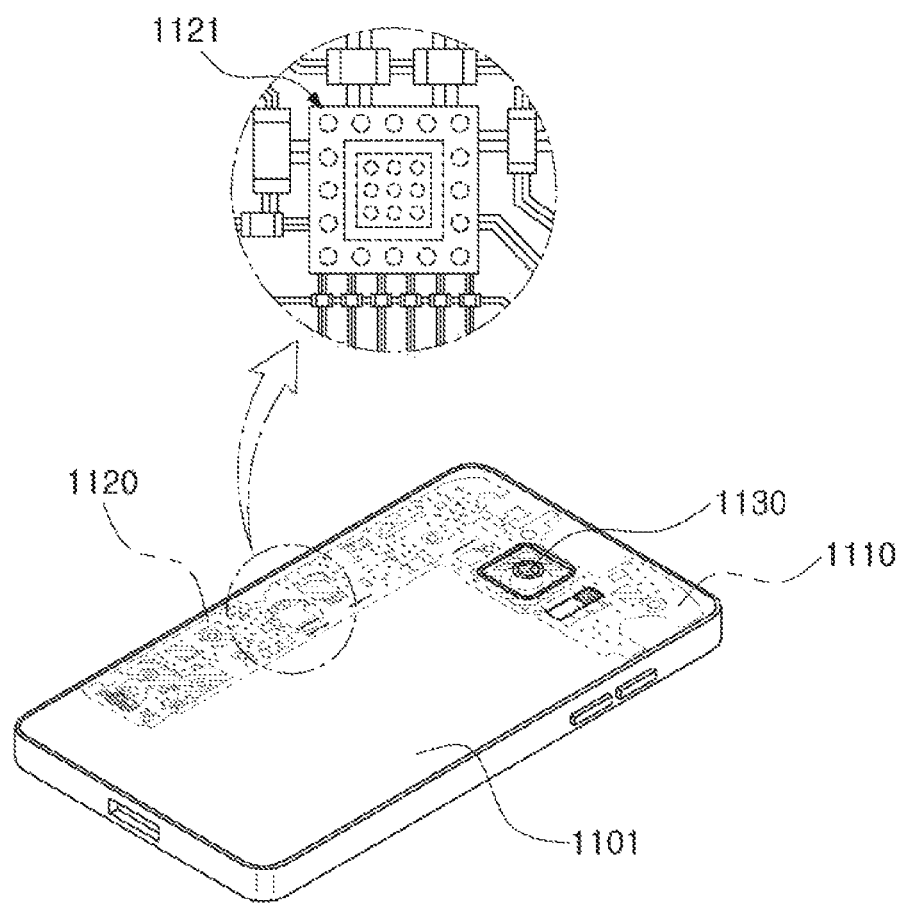
FIG. 2 is a schematic perspective view illustrating an example of an electronic device.

FIG. 2 is a schematic perspective view illustrating an example of an electronic device.

Referring to FIG. 2, a semiconductor package 1121 may be used for various purposes in the various electronic devices described above. For example, a motherboard 1110 may be accommodated in a body 1101 of a smartphone 1100, and may have various components 1120 physically and/or electrically connected thereto. In addition, other components that may or may not be connected physically or electrically to the main board 1110, such as the camera module 1130, may be accommodated in the body 1101. A portion of the components 1120 may be the chip-related component described above, for example, the semiconductor package 1121, but the chip-related component described above is not limited thereto. The electronic device is not limited to the smartphone 1100, and may also be the other electronic devices described above.

Semiconductor Package

Generally, numerous microelectronic circuits are integrated in a semiconductor chip. However, the semiconductor chip itself may not serve as a finished semiconductor product, and may be damaged due to an external physical or chemical impact. Therefore, the semiconductor chip itself is not used, but is packaged and used in an electronic device, or the like, in a packaged state.

Semiconductor packaging is required due to a difference in a circuit width between the semiconductor chip and a main board of the electronic device, with regard to electrical connectivity. In detail, the size of connection pads of the semiconductor chip and an interval between the connection pads may be very fine, but the size of component mounting pads of the main board used in the electronic device and an interval between the component mounting pads may be significantly greater than the scale of the semiconductor chip. Therefore, it may be difficult to directly mount the semiconductor chip on the main board, and a packaging technology for reducing the difference in circuit width between the semiconductor chip and the main board may be required.

A semiconductor package, manufactured by such a packaging technology, may be divided into a fan-in semiconductor package and a fan-out semiconductor package, depending on a structure and a purpose thereof.

The fan-in semiconductor package and the fan-out semiconductor package will hereinafter be described in more detail, with reference to the drawings.

Fan-In Semiconductor Package

Figure 3:
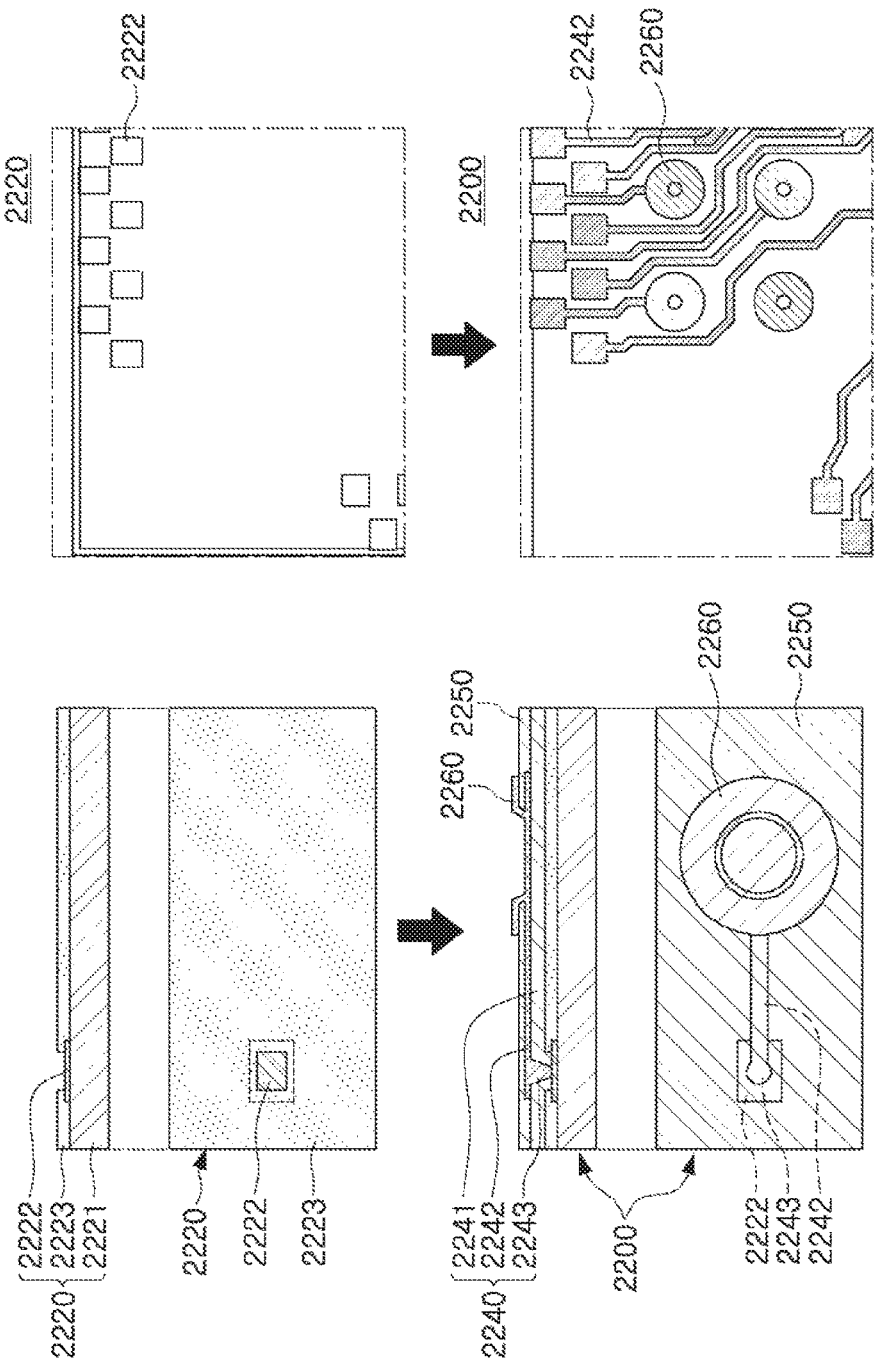
FIGS. 3A and 3B are schematic cross-sectional views illustrating states of a fan-in semiconductor package before and after the fan-in semiconductor package is packaged.

FIGS. 3A and 3B are schematic cross-sectional views illustrating states of a fan-in semiconductor package before and after the fan-in semiconductor package is packaged.

Figure 4:
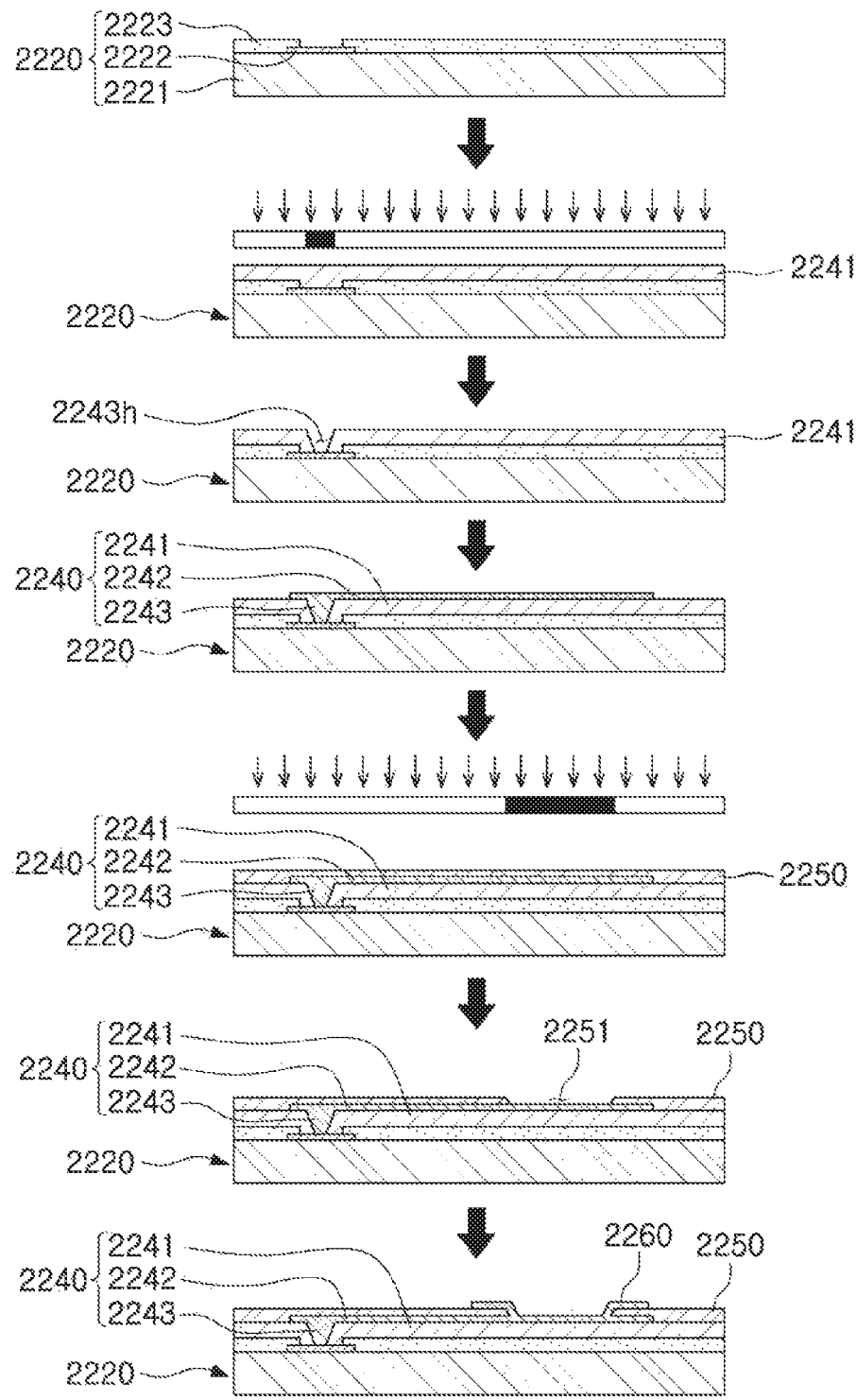
FIG. 4 illustrates schematic cross-sectional views illustrating a process of packaging a fan-in semiconductor package.

FIG. 4 illustrates schematic cross-sectional views illustrating a process of packaging a fan-in semiconductor package.

Referring to FIG. 4, a semiconductor chip 2220 may be, for example, an integrated circuit (IC) in a bare state including a body 2221 including silicon (Si), germanium (Ge), gallium arsenide (GaAs), or the like, a connection pad 2222 formed on one surface of the body 2221 and including a conductive material such as aluminum (Al), or the like, and a passivation layer 2223 such as an oxide film, a nitride film, or the like, formed on one surface of the body 2221 and covering at least a portion of the connection pad 2222. Since the connection pad 2222 is very small, it may be difficult to mount the IC on an intermediate level printed circuit board (PCB), as well as on a main board of an electronic device.

Therefore, depending on the size of the semiconductor chip 2220, a connection member 2240 may be formed on the semiconductor chip 2220, in order to redistribute the connection pad 2222. The connection member 2240 may be formed by forming an insulating layer 2241 on the semiconductor chip 2220 using an insulating material such as a photosensitive insulating resin (PID), forming a via hole 2243h exposing the connection pad 2222 in the insulating layer 2241, and forming a redistribution layer 2242 and a via 2243. Then, a passivation layer 2250, protecting the connection member 2240, may be formed, an opening portion 2251 may be formed, and an under-bump metal layer 2260, or the like, may be formed. That is, a fan-in semiconductor package 2200, including, for example, the semiconductor chip 2220, the connection member 2240, the passivation layer 2250, and the under-bump metal layer 2260, may be manufactured by a series of sub-processes.

As described above, the fan-in semiconductor package may have a package form in which the connection pad of the semiconductor chip, for example, all input/output (I/O) terminals, may be disposed inside the semiconductor chip, may have improved electrical characteristics, and may be produced at low cost. Therefore, many elements, embedded in a smartphone, have been manufactured in fan-in semiconductor package form. In detail, the elements have been developed to allow for rapid signal transfer, while having a compact size.

However, since all of the I/O terminals need to be disposed inside the semiconductor chip in the fan-in semiconductor package, the fan-in semiconductor package may have significant spatial limitations. Therefore, it may be difficult to apply such a structure to a semiconductor chip having a large number of I/O terminals, or to a semiconductor chip having a compact size. In addition, due to the disadvantages described above, the fan-in semiconductor package may not be directly mounted on the main board of the electronic device for use. Even when the size of the I/O terminals of the semiconductor chip and an interval therebetween are expanded by a redistribution process, the fan-in semiconductor package may not have a size or an interval sufficient to be directly mounted on the main board of the electronic device.

Figure 5:
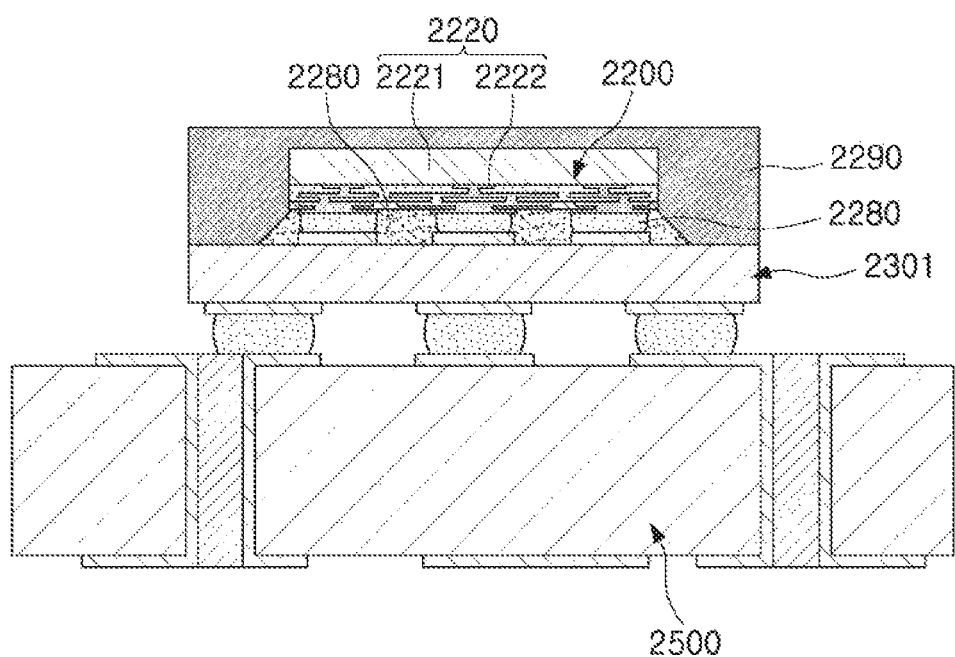
FIG. 5 is a schematic cross-sectional view illustrating a fan-in semiconductor package mounted on a printed circuit board (PCB) and mounted, ultimately, on a main board of an electronic device.

FIG. 5 is a schematic cross-sectional view illustrating a fan-in semiconductor package mounted on a PCB and mounted, ultimately, on a main board of an electronic device.

Figure 6:
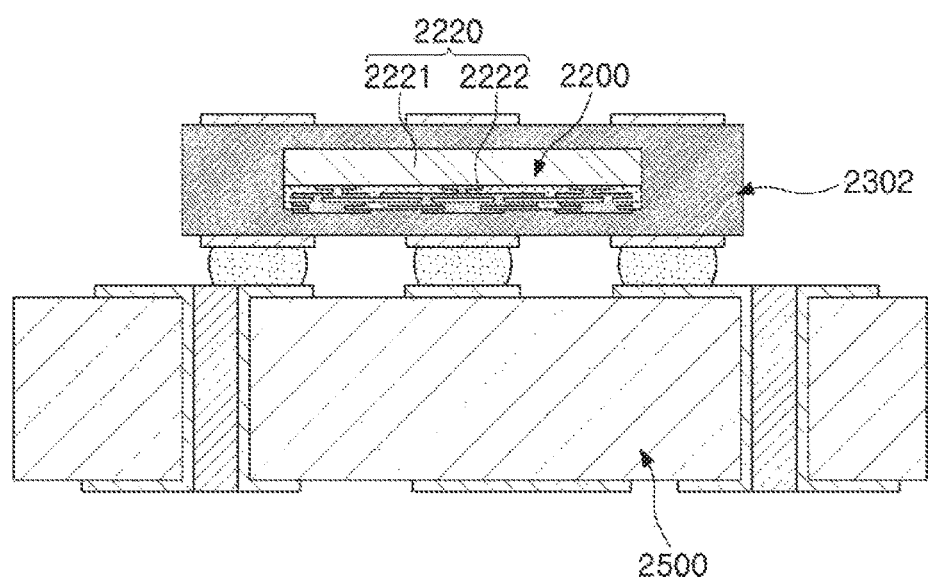
FIG. 6 is a schematic cross-sectional view illustrating a fan-in semiconductor package embedded in a PCB and mounted, ultimately, on a main board of an electronic device.

FIG. 6 is a schematic cross-sectional view illustrating a fan-in semiconductor package embedded in a PCB and mounted, ultimately, on a main board of an electronic device.

Referring to FIG. 5, in a fan-in semiconductor package 2200, connection pads 2222, for example, I/O terminals, of a semiconductor chip 2220, may be redistributed by a PCB 2301 for a second time, and the fan-in semiconductor package 2200 may be ultimately mounted on a main board 2500 of an electronic device, while being mounted on the PCB 2301. Here, a solder ball 2270, or the like, may be fixed by an underfill resin 2280, or the like, and an external surface thereof may be covered by a molding material 2290, or the like. Alternatively, the fan-in semiconductor package 2200 may be embedded in a separate PCB 2302, the connection pads 2222, for example, I/O terminals, of the semiconductor chip 2220 may be redistributed once more by the PCB 2302, while being embedded in the PCB 2302, and may be ultimately mounted on the main board 2500 of the electronic device.

As described above, it may be difficult to directly mount the fan-in semiconductor package on the main board of the electronic device for use. Therefore, the fan-in semiconductor package may be mounted on the separate PCB and may then be mounted on the main board of the electronic device by a packaging process, or may be mounted on the main board of the electronic device for use, while being embedded in the PCB.

Fan-Out Semiconductor Package

Figure 7:
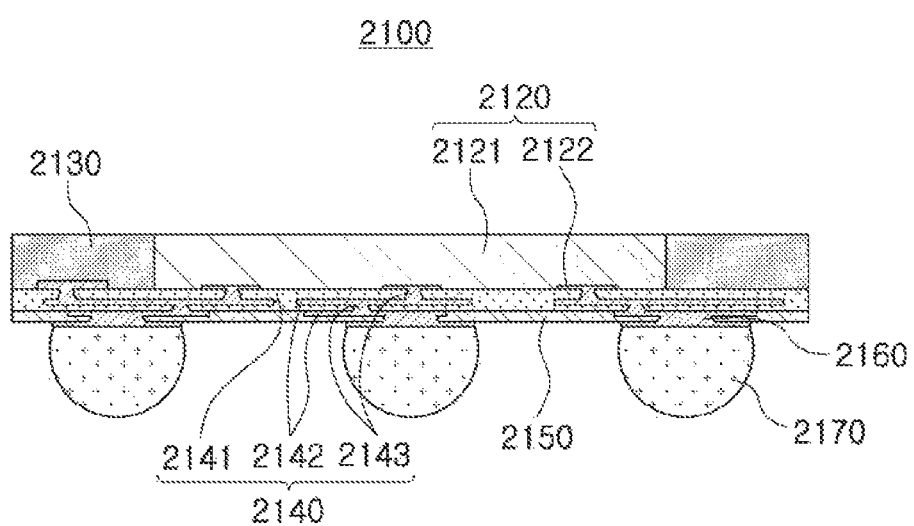
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and a connection pad 2122 of the semiconductor chip 2120 may be redistributed outwardly of the semiconductor chip 2120 by a connection member 2140. A passivation layer 2150 may further be formed on the connection member 2140, and an under-bump metal layer 2160 may further be formed in an opening portion of the passivation layer 2150. A solder ball 2170 may further be formed on the under-bump metal layer 2160. The semiconductor chip 2120 may be an IC including a body 2121, the connection pad 2122, the passivation layer, and the like. The connection member 2140 may include an insulating layer 2141, a redistribution layer 2142 formed on the insulating layer 2141, and a via 2143 electrically connecting the connection pad 2122 to the redistribution layer 2142.

As described above, the fan-out semiconductor package may have a structure in which I/O terminals of the semiconductor chip may be redistributed outwardly of the semiconductor chip by the connection member formed on the semiconductor chip. As described above, in the fan-in semiconductor package, all of the I/O terminals of the semiconductor chip need to be disposed inside the semiconductor chip. Accordingly, when the size of the semiconductor chip decreases, the size and pitch of balls need to be decreased, such that a standardized ball layout may not be used in the fan-in semiconductor package. On the other hand, the fan-out semiconductor package may have a structure in which the I/O terminals of the semiconductor chip are redistributed outwardly of the semiconductor chip by the connection member formed on the semiconductor chip, as described above. Accordingly, even when the size of the semiconductor chip decreases, a standardized solder ball layout may be used in the fan-out semiconductor package as is, so that the fan-out semiconductor package may be mounted on the main board of the electronic device without a separate PCB, as described below.

Figure 8:
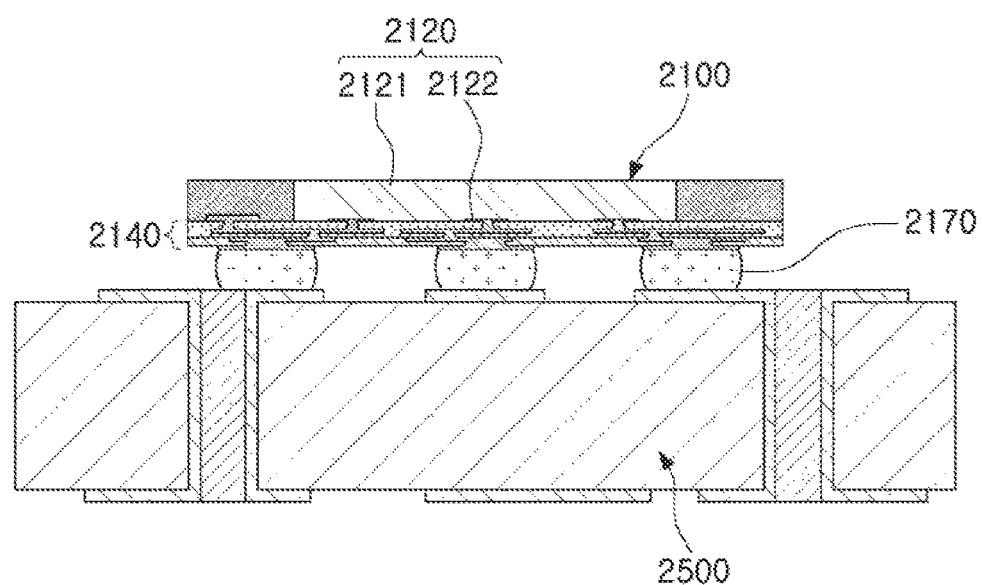
FIG. 8 is a schematic cross-sectional view illustrating a fan-out semiconductor package mounted on a main board of an electronic device.

FIG. 8 is a schematic cross-sectional view illustrating a fan-out semiconductor package mounted on a main board of an electronic device.

Referring to FIG. 8, a fan-out semiconductor package 2100 may be mounted on a main board 2500 of an electronic device by a solder ball 2170, or the like. For example, as described above, the fan-out semiconductor package 2100 may include the connection member 2140 formed on the semiconductor chip 2120 to be able to redistribute the connection pad 2122 to a fan-out region that is outside of the semiconductor chip 2120, such that the standardized ball layout may be used in the fan-out semiconductor package 2100 as is. As a result, the fan-out semiconductor package 2100 may be mounted on the main board 2500 of the electronic device without a separate PCB, or the like.

As described above, since the fan-out semiconductor package may be mounted on the main board of the electronic device without the separate PCB, the fan-out semiconductor package may have a thickness less than the fan-in semiconductor package using the PCB. Therefore, the fan-out semiconductor package may be miniaturized and thinned. In addition, the fan-out semiconductor package may have improved thermal characteristics and electrical characteristics, and thus the fan-out semiconductor package may particularly be suitable for mobile products. Further, the fan-out semiconductor package may be a more compact size than a general package-on-package (POP)-type semiconductor package using a PCB, and may solve problems caused by a warpage phenomenon.

The fan-out semiconductor package may refer to a package technology for mounting the semiconductor chip on the main board, or the like, of the electronic device, as described above, and protecting the semiconductor chip from an external impact. The fan-out semiconductor package may be conceptually different from a PCB, or the like, having a scale, a purpose, and the like, different from those of the fan-out semiconductor package, and having the fan-in semiconductor package embedded therein.

Semiconductor Package Module

Figure 9:
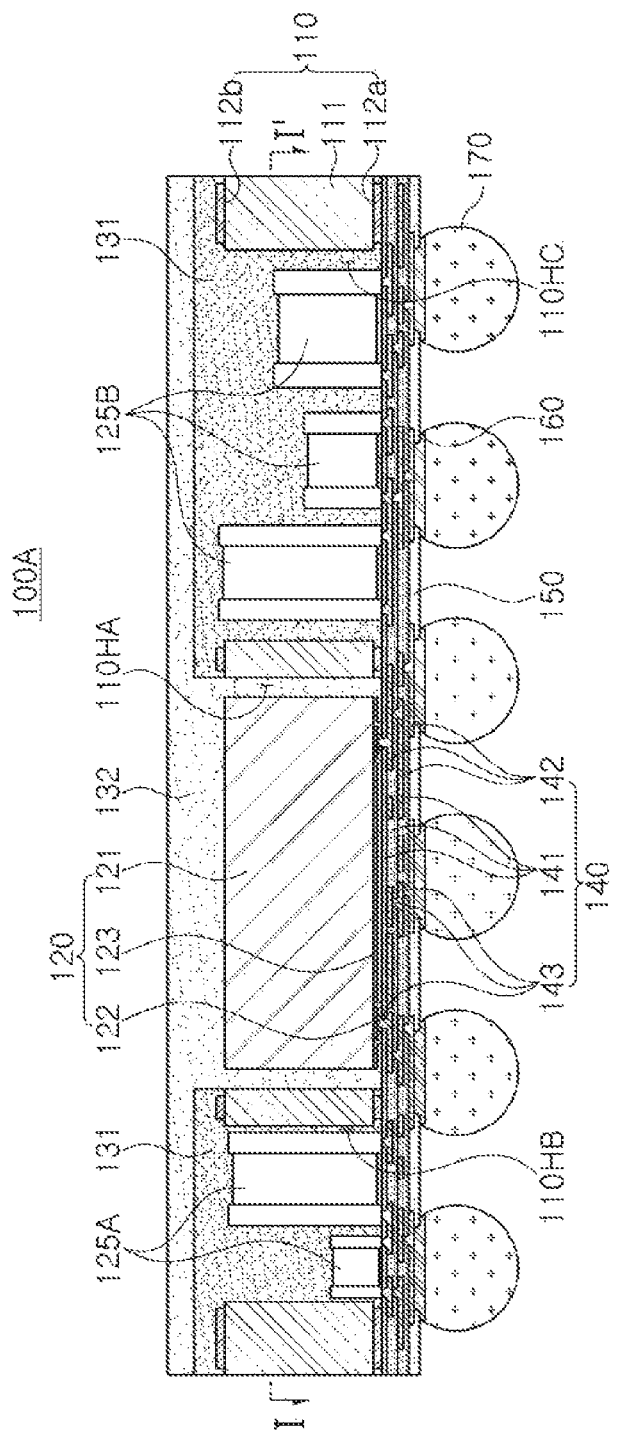
FIG. 9 is a schematic cross-sectional view illustrating an example of a fan-out semiconductor package module.

FIG. 9 is a schematic cross-sectional view illustrating an example of a fan-out semiconductor package.

Figure 10:
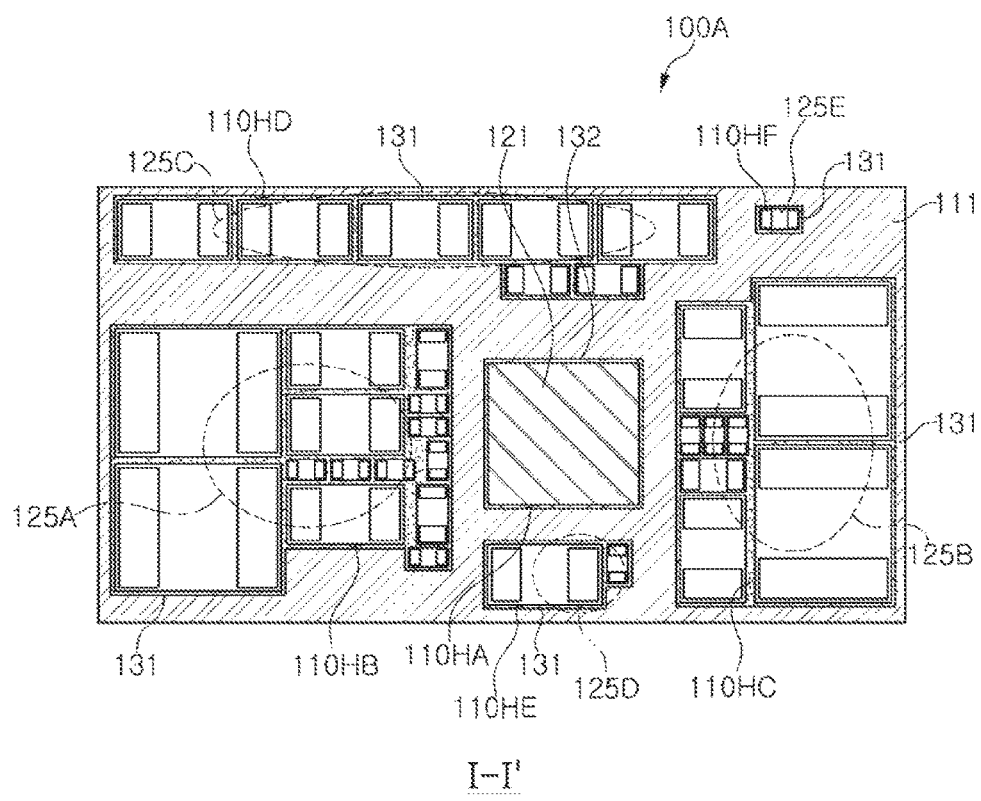
FIG. 10 is a schematic cut-away plan view taken along line I-I' of the fan-out semiconductor package module of FIG. 9.

FIG. 10 is a schematic cut-away plan view taken along line I-I' of the fan-out semiconductor package of FIG. 9.

Referring to FIGS. 9 and 10, a fan-out semiconductor package module 100A, according to an example, may include a core member 110 having first to sixth through holes 110HA to 110HF, a semiconductor chip 120 disposed within the first through hole 110HA, and having an active surface having connection pads 122 disposed thereon and an inactive surface opposite the active surface, at least one first passive component 125A disposed within the second through hole 110HB, at least one second passive component 125B disposed within the third through hole 110HC, at least one third passive component 125C disposed within the fourth through hole 110HD, at least one fourth passive component 125D disposed within the fifth through hole 110HE, at least one fifth passive component 125E disposed within the sixth through hole 110HF, a first encapsulant 131 encapsulating at least a portion of each of the core member 110 and the first to fifth passive components 125A to 125E and filling at least a portion of each of the second to sixth through holes 110HB to 110HF, a second encapsulant 132 encapsulating at least a portion of the inactive surface of the semiconductor chip 120 and filling at least a portion of the first through hole 110HA, a connection member 140 disposed on the core member 110, on the active surface of the semiconductor chip 120, and on the first to fifth passive components 125A to 125E, and including a redistribution layer 142 electrically connected to the connection pads 122 and to the first to fifth passive components 125A to 125E, a passivation layer 150 disposed on the connection member 140, a under-bump metal layer 160 formed in an opening portion of the passivation layer 150, and electrically connected to the redistribution layer 142, and an electrical connection structure 170 disposed on the under-bump metal layer 160, and electrically connected to the redistribution layer 142 by the under-bump metal layer 160.

As the size of displays for mobile devices increases, a need for increased battery capacity has arisen. Because mounting areas of batteries in the mobile device become larger with an increase in battery capacity, a reduction in the size of PCBs is being required. A resulting decrease in mounting areas of components may cause interest in modularization to continue to rise. One example of a conventional technique for mounting a plurality of components is a chip on board (COB) technique. COB is a method of mounting an individual passive element and a semiconductor package on a PCB, using surface-mount technology (SMT). This method may be advantageous in terms of cost, but may require a wide mounting area due to significantly reduced spacing retained between components, may cause a significant increase in electromagnetic interference (EMI) between the components, and may lead to increased electrical noise due to a relatively long distance between semiconductor chips and passive components.

In contrast, in the fan-out semiconductor package module 100A, according to an example, the first to fifth passive components 125A to 125E may be disposed within a single package, together with the semiconductor chip 120, to be modularized. Therefore, significantly reduced spacing between the components may allow mounting areas thereof on a PCB, such as a motherboard or the like, to be significantly reduced. Further, lengths of electrical paths between the semiconductor chip 120 and the first to fifth passive components 125A to 125E may be significantly reduced, thus solving the problem of noise. In particular, the first to fifth passive components 125A to 125E may undergo a two or more step encapsulation process, rather than a one-step encapsulation process, thus significantly reducing an influence on mounting yield, the effects of foreign substances, or the like, caused by mounting the first to fifth passive components 125A to 125E.

In detail, surface mounting of the first to fifth passive components 125A to 125E may be relatively easy. However, since a high degree of accuracy and a clean environment may be required for surface mounting of the semiconductor chip 120, the surface mounting of the semiconductor chip 120 may be relatively difficult. Therefore, when a process of mounting and encapsulating the first to fifth passive components 125A to 125E and a process of mounting and encapsulating the semiconductor chip 120 are performed separately, influence on mounting yield, the effects of foreign substances, or the like, in both processes, may be significantly reduced. In particular, the semiconductor chip 120, which is relatively expensive, may only be mounted on a separate good-quality unit by a precise process, subsequent to mounting and encapsulating the first to fifth passive components 125A to 125E, thus having a high degree of yield. Further, the first to fifth passive components 125A to 125E having various thicknesses and/or the semiconductor chip 120 may be stably fixed, and various problems caused by the thickness variation may be solved.

Hereinafter, the respective components, included in the fan-out semiconductor package module 100A, according to an example, will be described in more detail.

The core member 110 may further increase the rigidity of the fan-out semiconductor package module 100A, according to material types thereof, and may serve to ensure uniform thicknesses of the first and second encapsulants 131 and 132. The core member 110 may have the first to sixth through holes 110HA to 110HF. The first to sixth through holes 110HA to 110HF may be physically spaced from one another. The semiconductor chip 120, the first passive component 125A, the second passive component 125B, the third passive component 125C, the fourth passive component 125D, and the fifth passive component 125E may be disposed within the first through hole 110HA, the second through hole 110HB, the third through hole 110HC, the fourth through hole 110HD, the fifth through hole 110HE, and the sixth through hole 110HF, respectively. The semiconductor chip 120, the first passive component 125A, the second passive component 125B, the third passive component 125C, the fourth passive component 125D, and the fifth passive component 125E may be spaced from a wall surface of the first through hole 110HA, a wall surface of the second through hole 110HB, a wall surface of the third through hole 110HC, a wall surface of the fourth through hole 110HD, a wall surface of the fifth through hole 110HE, and a wall surface of the sixth through hole 110HF by predetermined distances, respectively, to be surrounded by the wall surfaces thereof. Such a structure may be modified.

The core member 110 may include an insulating layer 111. A material of the insulating layer 111 is not particularly limited. For example, the material of the insulating layer 111 may be an insulating material. The insulating material may be a thermosetting resin such as an epoxy resin, a thermoplastic resin such as polyimide, or a resin such as a prepreg, an Ajinomoto build-up film (ABF), FR-4, or bismaleimide triazine (BT), in which a core such as an inorganic filler, a glass fiber, a glass cloth, or a glass fabric is impregnated with the thermosetting resin and the thermoplastic resin. Alternatively, a photoimagable dielectric (PID) resin may also be used.

The core member 110 may include conductive layers 112a and 112b disposed on opposite surfaces of the insulating layer 111. The conductive layers 112a and 112b may be used as marking patterns to form the first to sixth through holes 110HA to 110HF, or to dispose the semiconductor chip 120 and the first to fifth passive components 125A to 125E. Alternatively, the conductive layers 112a and 112b may also be used as wiring patterns. For example, the conductive layers 112a and 112b may be ground (GND) patterns. A material of each of the conductive layers 112a and 112b may be copper (Cu), aluminum (Al), silver (Ag), tin (Sn), gold (Au), nickel (Ni), lead (Pb), titanium (Ti), or any alloy thereof, but is not limited thereto.

The semiconductor chip 120 may be an IC provided in an amount of several hundreds to several millions of elements or more integrated in a single chip. The IC may be, for example, a power management integrated circuit (PMIC), but is not limited thereto. The semiconductor chip may be an IC in a bare state, in which a separate bump or redistribution layer is not formed. The IC may be formed on the basis of an active wafer. In this case, silicon (Si), germanium (Ge), or gallium arsenide (GaAs) may be used as a base material forming a body 121 of the semiconductor chip. The body 121 may have various types of circuits formed therein. A connection pad 122 may electrically connect the semiconductor chip 120 to other components, and a material of the connection pad 122 may be a conductive material, such as aluminum (Al) or the like, but is not particularly limited. The body 121 may have a passivation film 123 formed thereon to allow the connection pad 122 to be exposed, and the passivation film 123 may be an oxide film, a nitride film, or a dual layer of an oxide film and a nitride film. An insulating film (not illustrated) or the like may further be disposed in other required positions.

Each of the first to fifth passive components 125A to 125E may independently be a multilayer ceramic capacitor (MLCC), a low inductance chip capacitor (LICC), an inductor, or beads. The first to fifth passive components 125A to 125E may have different thicknesses. Further, each of the first to fifth passive components 125A to 125E may have a different thickness from the semiconductor chip 120. The fan-out semiconductor package module 100A, according to an example, may allow the first to fifth passive components 125A to 125E and the semiconductor chip 120 to be encapsulated in two or more steps, thus significantly reducing the number of defects due to such thickness deviations. The number of the first to fifth passive components 125A to 125E is not particularly limited, and may also be more or less than that illustrated in the drawings.

The first encapsulant 131 may encapsulate at least a portion of each of the first to fifth passive components 125A to 125E. Further, the first encapsulant 131 may fill at least a portion of each of the second to sixth through holes 110HB to 110HF. Further, the first encapsulant 131 may cover at least a portion of the core member 110. The first encapsulant 131 may include an insulating material. The insulating material may be a material including an inorganic filler and an insulating resin, for example, a thermosetting resin such as an epoxy resin, a thermoplastic resin such as polyimid, or a resin, particularly, an ABF, a FR-4 resin, a BT resin, a PID resin, or the like, in which a stiffener such as an inorganic filler is included in the thermosetting resin and the thermoplastic resin. Further, a known molding material, such as an epoxy molding compound (EMC) or the like, may be used, and a photosensitive material, such as a photoimageable encapsulant (PIE), may also be used. A material, in which a core, such as an inorganic filler, a glass fiber, a glass cloth, or a glass fabric, may be impregnated with an insulating resin, such as a thermosetting resin or a thermoplastic resin, may also be used.

The second encapsulant 132 may encapsulate at least a portion of the semiconductor chip 120. Further, the second encapsulant 132 may fill at least a portion of the first through hole 110HA. Further, the second encapsulant 132 may cover at least a portion of the first encapsulant 131. The second encapsulant 132 may also include an insulating material. The insulating material may be a material including an inorganic filler and an insulating resin, for example, a thermosetting resin such as an epoxy resin, a thermoplastic resin such as polyimid, or a resin, particularly, an ABF, a FR-4 resin, a BT resin, a PID resin, or the like, in which a stiffener such as an inorganic filler is included in the thermosetting resin and the thermoplastic resin. Further, a known molding material, such as an EMC or the like, may also be used. A material, in which a core, such as an inorganic filler, a glass fiber, a glass cloth, or a glass fabric, may be impregnated with an insulating resin, such as a thermosetting resin or a thermoplastic resin, may also be used.

The first encapsulant 131 and the second encapsulant 132 may include the same material, and may also include different materials. Even when the first encapsulant 131 and the second encapsulant 132 include the same material, a boundary or an interface therebetween may be identified. The first encapsulant 131 and the second encapsulant 132 may include a similar material, but may have different colors. For example, the first encapsulant 131 may be more transparent than the second encapsulant 132. Accordingly, the boundary or the interface therebetween may be apparent.

The connection member 140 may allow the connection pad 122 of the semiconductor chip 120 to be redistributed. Further, the connection member 140 may electrically connect the semiconductor chip 120 to the first to fifth passive components 125A to 125E. Several tens to several hundreds of connection pads 122 having various functions, of the semiconductor chip 120, may be redistributed by the connection member 140, and may be physically and/or electrically connected to an external power source by the electrical connection structure 170, depending on the functions thereof. The connection member 140 may include an insulating layer 141, a redistribution layer 142 disposed on the insulating layer 141, and a via 143 passing through the insulating layer 141, and connecting the redistribution layer 142. The connection member 140 may include a single layer, and may also include a plurality of layers in an amount greater than that illustrated in the drawings.

A material of the insulating layer 141 may be an insulating material. The insulating material may be a photosensitive insulating material, such as a PID resin, in addition to the above-mentioned insulating material. For example, the insulating layer 141 may be a photosensitive insulating layer. When the insulating layer 141 has photosensitive properties, the insulating layer 141 may have a further reduced thickness, and a fine pitch of the via 143 may be achieved more easily. The insulating layer 141 may be a photosensitive insulating layer including an insulating resin and a filler. When the insulating layer 141 includes a plurality of layers, materials thereof may be the same as each other, and may also be different from each other. When the insulating layer 141 includes a plurality of layers, the layers may be integrally formed, depending on processes, so that a boundary therebetween may not be readily apparent.

The redistribution layer 142 may serve to substantially redistribute the connection pad 122. A material of the redistribution layer 142 may be a conductive material, such as copper (Cu), aluminum (Al), silver (Ag), tin (Sn), gold (Au), nickel (Ni), lead (Pb), titanium (Ti), or any alloy thereof. The redistribution layer 142 may perform various functions, depending on designs of the layers thereof. For example, the redistribution layer 142 may include a ground (GND) pattern, a power (PWR) pattern, a signal (S) pattern, and the like. Here, the signal (S) pattern may include various signals, except for the ground (GND) pattern, the power (PWR) pattern, and the like, such as data signals, and the like. Further, the redistribution layer 142 may include a via pad, a connection terminal pad, and the like.

The via 143 may electrically connect the redistribution layer 142, the connection pad 122, the first to fifth passive components 125A to 125E, or the like, formed in different layers, to one another, resulting in formation of an electrical path in the fan-out semiconductor package module 100A. The via 143 may be in physical contact with the connection pad 122 and the first to fifth passive components 125A to 125E. For example, the semiconductor chip 120 may be directly connected to the via 143 of the connection member 140 in bare die form without a separate bump or the like, and the first to fifth passive components 125A to 125E may be directly connected to the via 143 of the connection member 140 in embedded-type surface mount form using a solder bump or the like. A material of the via 143 may be a conductive material, such as copper (Cu), aluminum (Al), silver (Ag), tin (Sn), gold (Au), nickel (Ni), lead (Pb), titanium (Ti), or any alloy thereof. The via 143 may be fully filled with the conductive material, or the conductive material may also be formed along a wall surface of the via 143. Further, the via 143 may have all shapes known in the related art, such as a tapered shape, a cylindrical shape, or the like.

The passivation layer 150 may protect the connection member 140 from external physical or chemical damage. The passivation layer 150 may have an opening portion exposing at least a portion of the redistribution layer 142 of the connection member 140. The opening portion may be formed in the passivation layer 150 in an amount of several tens to several thousands. The passivation layer 150 may include an insulating resin and an inorganic filler, and may not include a glass fiber. For example, the passivation layer 150 may be an ABF, but is not limited thereto.

The under-bump metal layer 160 may increase connection reliability of the electrical connection structure 170, resulting in an increase in board level reliability of the fan-out semiconductor package module 100A. The under-bump metal layer 160 may be connected to the redistribution layer 142 of the connection member 140 exposed by the opening portion of the passivation layer 150. The under-bump metal layer 160 may be formed in the opening portion of the passivation layer 150 by a known metallization method, using a known conductive material, for example, a metal, and the method of forming the under-bump metal layer 160 is not limited thereto.

The electrical connection structure 170 may be an additional component physically and/or electrically connecting the fan-out semiconductor package module 100A to an external power source. For example, the fan-out semiconductor package module 100A may be mounted on a main board of an electronic device by the electrical connection structure 170. The electrical connection structure 170 may be formed of a conductive material, for example, a solder or the like. However, this is only an example, and a material of the electrical connection structure 170 is not particularly limited. The electrical connection structure 170 may be a land, a ball, a pin, or the like. The electrical connection structure 170 may include a single layer or a plurality of layers. When the electrical connection structure 170 includes the layers, the electrical connection structure 170 may include a copper pillar and a solder. When the electrical connection structure 170 includes the single layer, the electrical connection structure 170 may include a tin-silver solder or copper. However, this is only an example, and a material of the electrical connection structure 170 is not limited thereto. The number, interval, disposition, or the like, of electrical connection structures 170 is not particularly limited, and may be readily modified by a person skilled in the art, depending on design particulars. For example, several tens to several thousands of electrical connection structures 170 may be provided, according to the number of connection pads 122, and the electrical connection structure 170 may also be provided in an amount not less than or not more than several tens to several thousands.

At least one of the electrical connection structures 170 may be disposed in a fan-out region. The fan-out region may denote a region, except for a region in which the semiconductor chip 120 may be disposed. The fan-out semiconductor package may have improved reliability, as compared to the fan-in semiconductor package, may have a plurality of I/O terminals, and may facilitate a 3D interconnection. Further, as compared to a ball grid array (BGA) semiconductor package, a land grid array (LGA) semiconductor package, or the like, the fan-out semiconductor package may be manufactured to have a reduced thickness, and may have improved price competitiveness.

Figure 11:
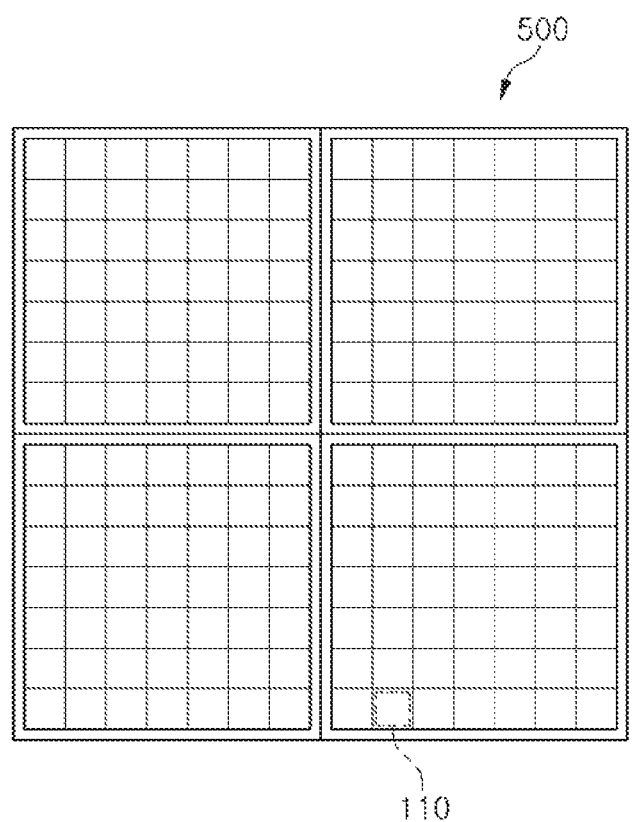
FIG. 11 is a schematic cross-sectional view illustrating an example of a panel used to make the fan-out semiconductor package module of FIG. 9.

FIG. 11 is a schematic cross-sectional view illustrating an example of a panel used to make the fan-out semiconductor package module of FIG. 9.

Referring to FIG. 11, the fan-out semiconductor package module 100A, according to an example, may be manufactured using a panel 500 having a large size. The size of the panel 500 may be two to four times more than that of a common wafer. Therefore, a greater number of fan-out semiconductor package modules 100A may be manufactured in a single process including a series of sub-processes. The panel 500 may have a square shape or a rectangular shape. As a result, productivity may be significantly increased. In particular, as the size of each fan-out semiconductor package module 100A increases, productivity may be relatively increased, as compared to a case in which a wafer is used to manufacture the fan-out semiconductor package module 100A. Each unit of the panel 500 may be the core member 110 initially prepared in a method of manufacturing the fan-out semiconductor package module to be described below. A plurality of fan-out semiconductor package modules 100A may be simultaneously manufactured by a single process including a series of sub-processes, using the panel 500, and then the fan-out semiconductor package modules 100A may be cut into respective fan-out semiconductor package modules 100A, by a known cutting process, such as a dicing process or the like.

FIGS. 12A through 12D are schematic cross-sectional views illustrating an example of a process of manufacturing the fan-out semiconductor package module of FIG. 9.

Figure 12A:
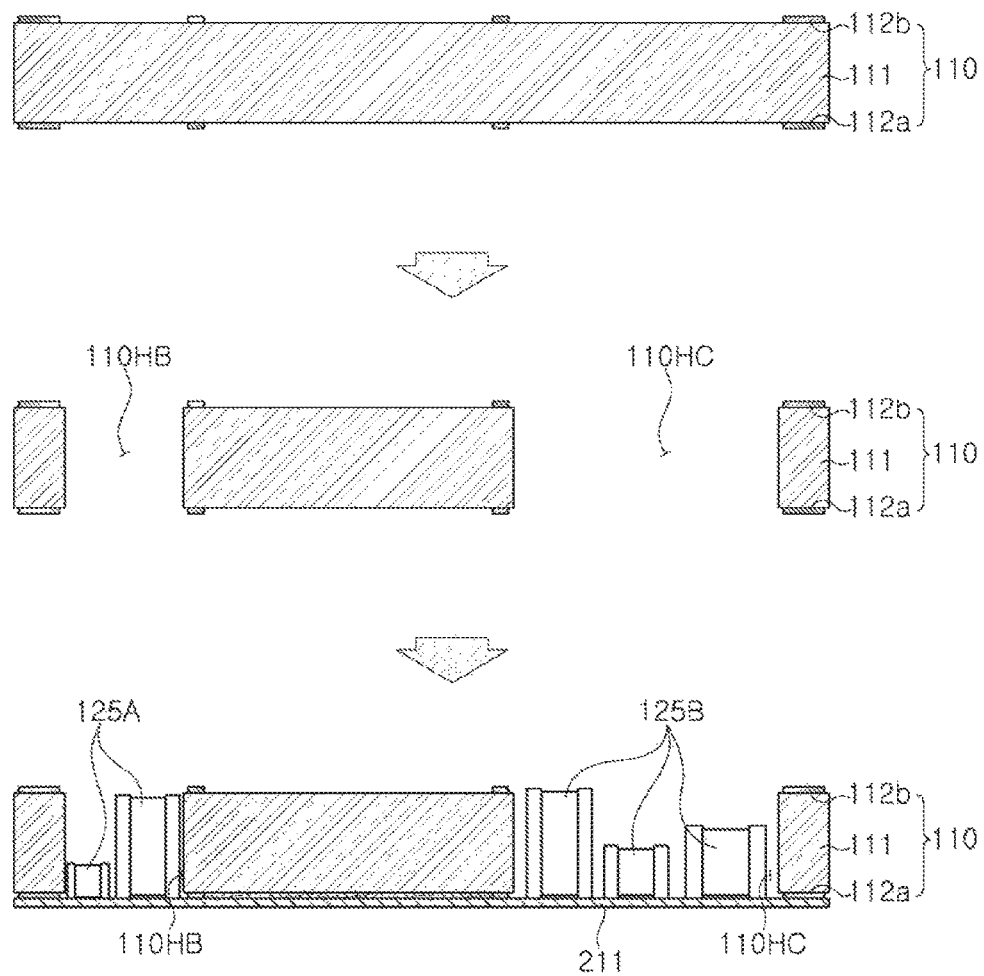
FIGS. 12A, 12B, 12C, and 12D are schematic cross-sectional views illustrating an example of a process of manufacturing the fan-out semiconductor package module of FIG. 9.

Referring to FIG. 12A, a core member 110 may first be prepared. The core member 110 may be formed by preparing a CCL as the above-mentioned panel 500 and then patterning a copper foil of the CCL into conductive layers 112*a* and 112*b*. Subsequently, each of second to sixth through holes 110HB to 110HF may be formed in the core member 110. Only the second through hole 110HB and the third through hole 110HC are illustrated in FIG. 12A, the cross-sectional view. However, the fourth to sixth through holes 110HD to 110HF may also be formed. Each of the second to sixth through holes 110HB to 110HF may be formed by a laser drilling process and/or a mechanical drilling process, depending on a material of an insulating layer 111. In some cases, a sand blasting process or a chemical process may also be used. Subsequently, a first adhesive film 211 may be attached to a lower surface of the core member 110, and first to fifth passive components 125A to 125E may be disposed in the second to sixth through holes 110HB to 110HF. The first adhesive film 211 may be a known tape, but is not limited thereto.

Figure 12B:
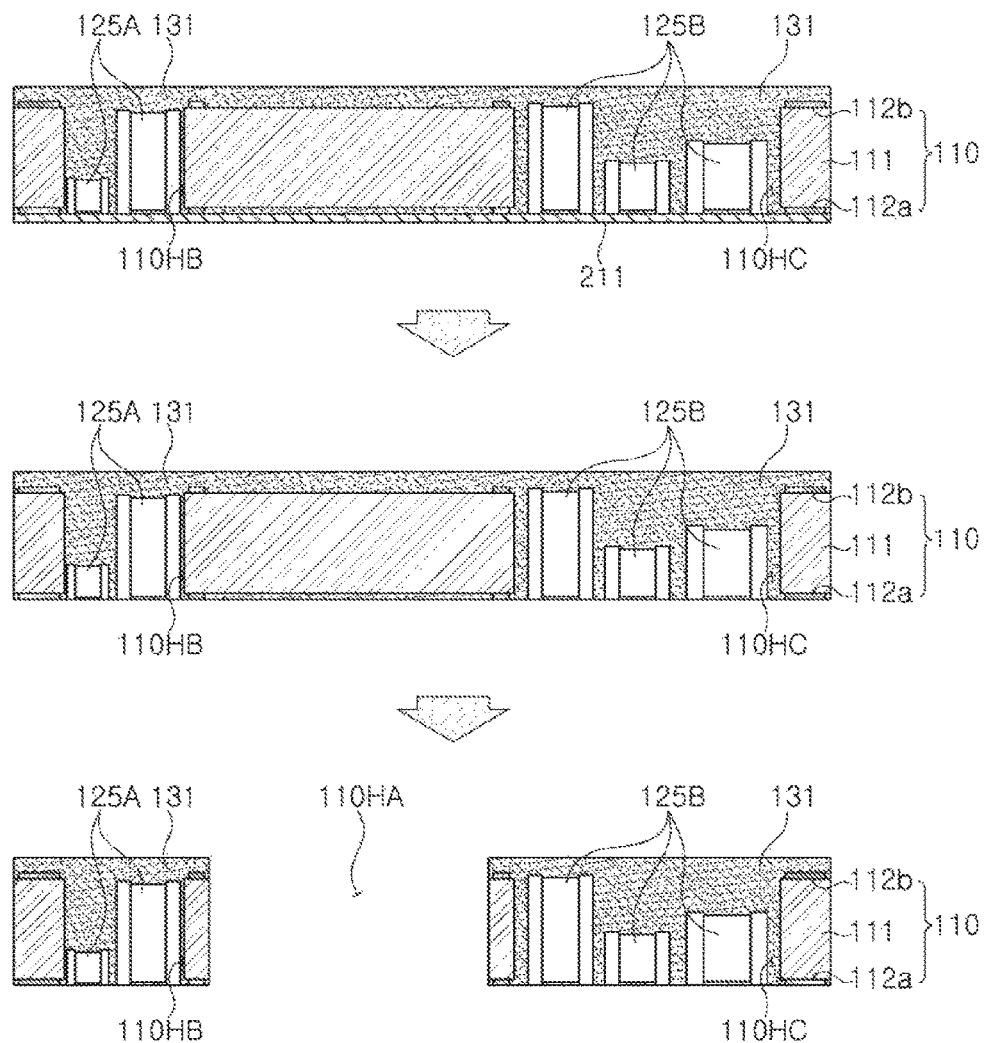

Referring to FIG. 12B, the core member 110 and the first to fifth passive components 125A to 125E may be encapsulated by a first encapsulant 131. The first encapsulant 131 may be formed by a method of laminating a film in an uncured state and curing the film, and may also be formed by a method of applying and curing a liquid material. Subsequently, the first adhesive film 211 may be removed. A method of removing the first adhesive film 211 may be a mechanical method. Subsequently, a first through hole 110HA may be formed in the core member 110. The first through hole 110HA may penetrate through a stacked structure including the core member 110 and a portion of the first encapsulant 131 disposed on the core member 110. The first through hole 110HA may also be formed by a laser drilling process and/or a mechanical drilling process, depending on the material of the insulating layer 111. In some cases, a sand blasting process or a chemical process may also be used. In the process of forming the first through hole 110HA, a region of the first encapsulant 131, corresponding to the first through hole 110HA, may be penetrated.

Figure 12C:
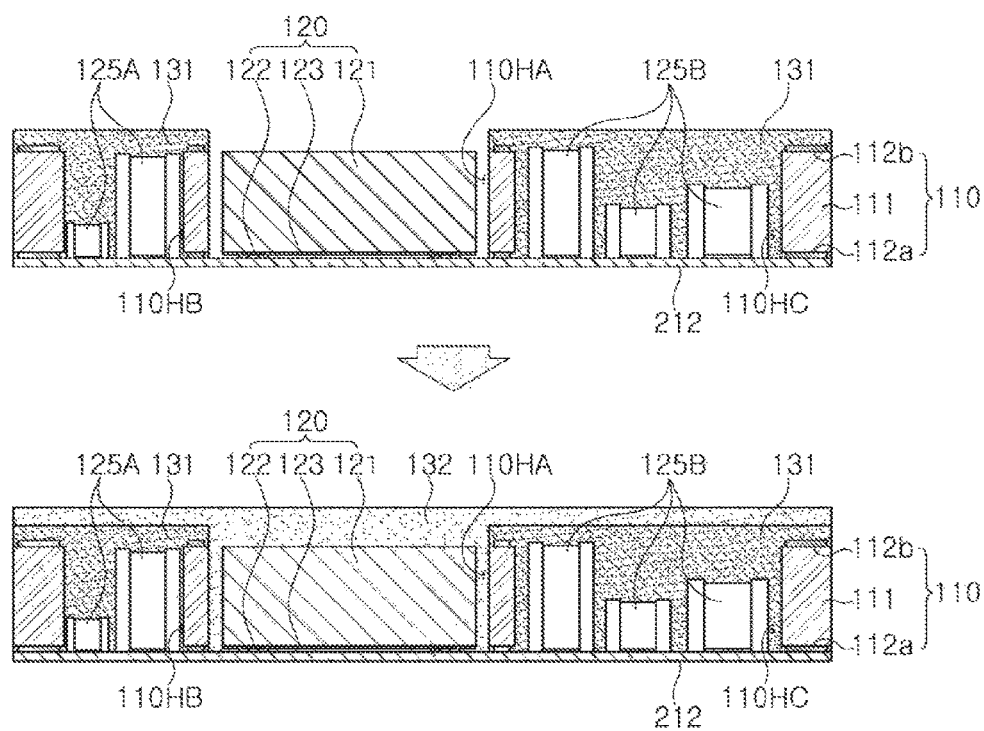

Referring to FIG. 12C, a second adhesive film 212 may be attached to the lower surface of the core member 110, and a semiconductor chip 120 may be disposed in the first through hole 110HA. The semiconductor chip 120 may be disposed in a face-down manner. The second adhesive film 212 may also be a known tape, but is not limited thereto. Subsequently, the first encapsulant 131 and the semiconductor chip 120 may be encapsulated by the second encapsulant 132. The second encapsulant 132 may be formed by a method of laminating a film in an uncured state and curing the film, and may also be formed by a method of applying and curing a liquid material.

Figure 12D:
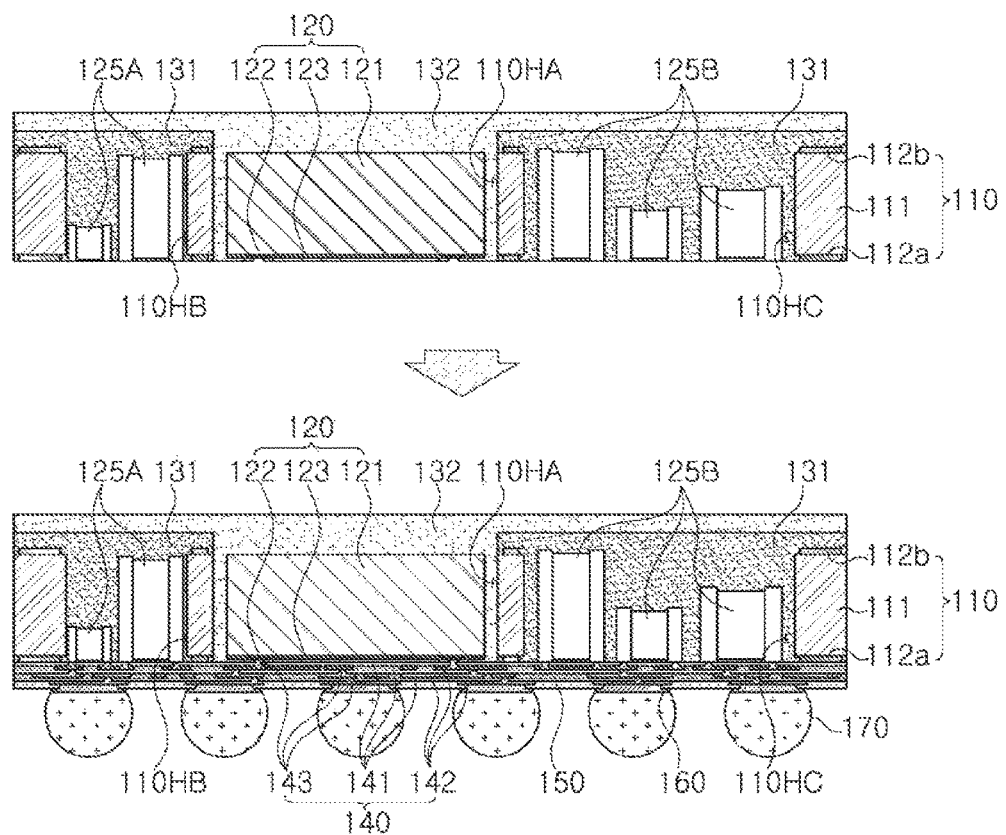

Referring to FIG. 12D, the second adhesive film 212 may be removed. A method of removing the second adhesive film 212 may also be a mechanical method. Subsequently, a connection member 140 may be formed on a lower region from which the second adhesive film 212 has been removed. The connection member 140 may be formed by forming an insulating layer 141 by a known lamination or application method, forming a hole for a via 143 by a photolithography method, or by a laser drilling process and/or a mechanical drilling process, and forming a redistribution layer 142 and the via 143 by a known plating method, such as an electroplating method, an electroless plating method, or the like. Subsequently, a passivation layer 150 may be formed by a known lamination or application method, an under-bump metal layer 160 may be formed by a known metallization method, and an electrical connection structure 170 may be formed by a known method.

When the panel 500, or the like, of FIG. 11 is used, a plurality of fan-out semiconductor package modules 100A may be manufactured in a single process including a series of sub-processes. The fan-out semiconductor package modules 100A may then be diced into respective fan-out semiconductor package modules 100A by a dicing process or the like.

Figure 13:
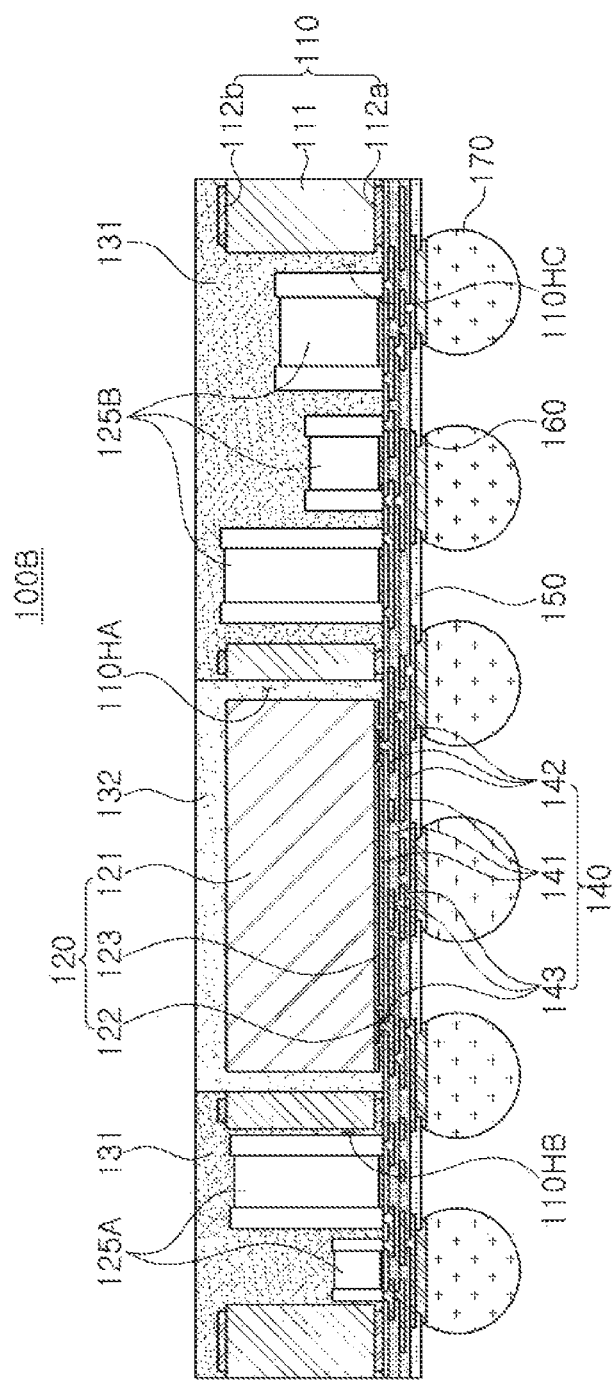
FIG. 13 is a schematic cross-sectional view illustrating another example of a fan-out semiconductor package module.

FIG. 13 is a schematic cross-sectional view illustrating another example of a fan-out semiconductor package module.

Referring to FIG. 13, in a fan-out semiconductor package module 100B, according to another example, a second encapsulant 132 may not cover a first encapsulant 131. Such a structure may be achieved by forming the second encapsulant 132 in the same manner as UF jetting. Upper surfaces of the first encapsulant 131 and the second encapsulant 132 may be substantially coplanar with each other. For example, the upper surfaces of the first encapsulant 131 and the second encapsulant 132 may be disposed on the same level. Conceptually, the same level may include a fine difference in levels thereof. For example, the same level may denote that the levels of the first encapsulant 131 and the second encapsulant 132 may be substantially the same. In this case, the thickness of the fan-out semiconductor package module 100B may be significantly reduced. Descriptions of elements or manufacturing methods overlapping previously provided descriptions thereof will be omitted.

Figure 14:
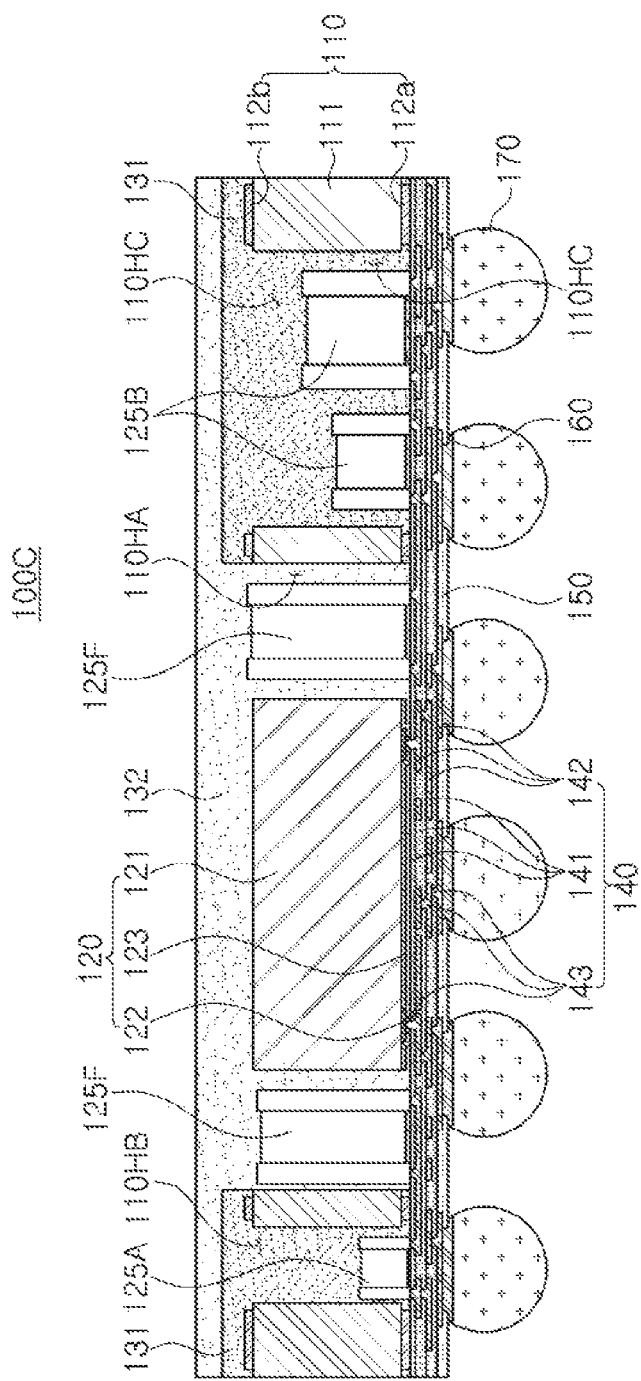
FIG. 14 is a schematic cross-sectional view illustrating another example of a fan-out semiconductor package module.

FIG. 14 is a schematic cross-sectional view illustrating another example of a fan-out semiconductor package module.

Referring to FIG. 14, in a fan-out semiconductor package module 100C, according to another example, a first passive component 125A and a second passive component 125B, each having a relatively reduced thickness, may be disposed in a second through hole 110HB and a third through hole 110HC, respectively, in which a semiconductor chip 120 is not disposed, and a sixth passive component 125F, having a relatively increased thickness, may be disposed in a first through hole 110HA in which the semiconductor chip 120 is disposed. Since a first encapsulant 131 itself, encapsulating the first and second passive components 125A and 125B, each having a relatively reduced thickness, may have a reduced thickness, the thickness of the fan-out semiconductor package module 100C may be reduced, and problems caused by thickness variations may be solved more effectively. In particular, when the sixth passive component 125F is an element, for example, a power inductor (PI) or the like, that needs to be close to the semiconductor chip 120, a length of an electrical path therebetween may further be significantly reduced, and thus the fan-out semiconductor package module 100C may have various advantages. Although not illustrated in FIG. 14, the cross-sectional view, other through holes, such as fourth to sixth through holes 110HD to 110HF, may further be formed, and passive components, such as third to fifth passive components 125C to 125E, each having a relatively reduced thickness, may be disposed therein. Descriptions of elements or manufacturing methods overlapping previously provided descriptions thereof will be omitted.

Figure 15:
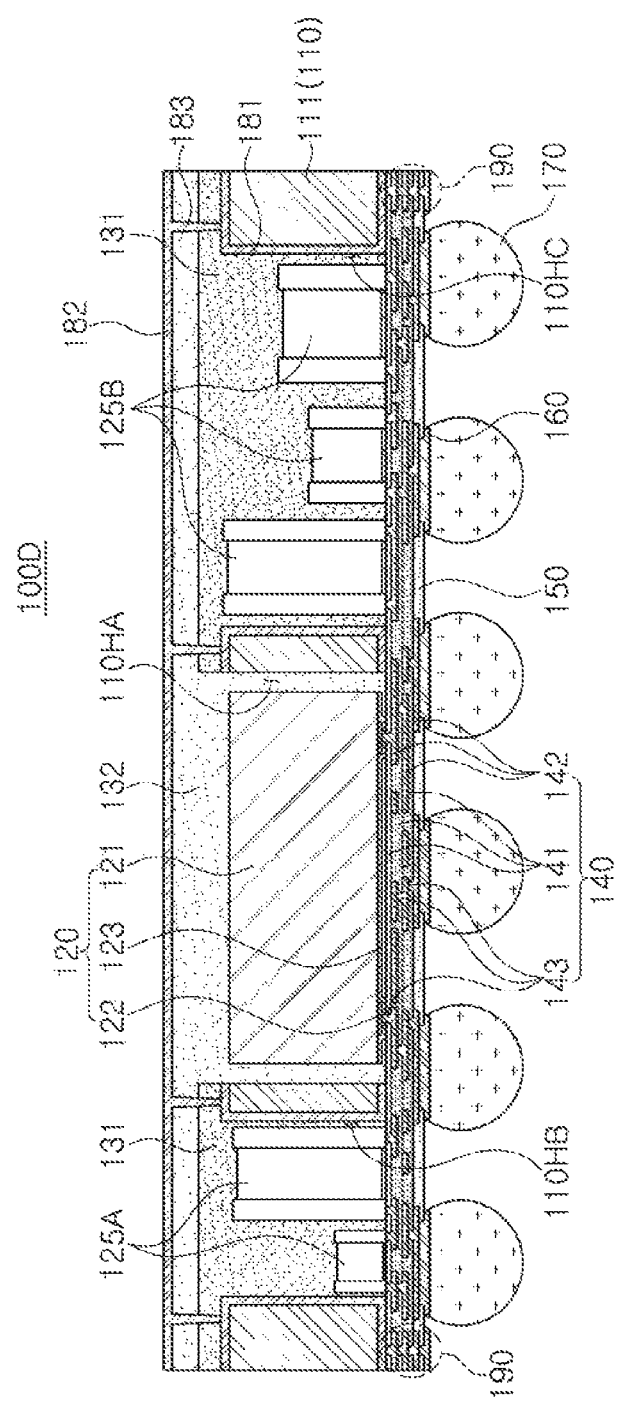
FIG. 15 is a schematic cross-sectional view illustrating another example of a fan-out semiconductor package module.

FIG. 15 is a schematic cross-sectional view illustrating another example of a fan-out semiconductor package module.

Referring to FIG. 15, a fan-out semiconductor package module 100D, according to another example, may further include a metal layer 181 and a backside metal layer 182 for EMI shielding and heat dissipation, and a backside via 183, in addition to the fan-out semiconductor package module 100A, according to an example, described above. The metal layer 181 may be formed on a wall surface of each of a second through hole 110HB and a third through hole 110HC to have a plate shape, thus surrounding a first passive component 125A and a second passive component 125B. The metal layer 181, having the plate shape, may extend to an upper surface and a lower surface of a core member 110.

The backside metal layer 182 may be formed on a second encapsulant 132 to have a plate shape, thus shielding an upper portion of the fan-out semiconductor package module 100D. The metal layer 181 and the backside metal layer 182 may significantly increase the effects of EMI shielding and heat dissipation. The backside via 183 may pass through at least portions of a first encapsulant 131 and the second encapsulant 132 to connect the metal layer 181 to the backside metal layer 182. Each of the metal layer 181, the backside metal layer 182, and the backside via 183 may include a conductive material, such as copper (Cu) or the like, and may be formed by a known plating method or the like. The metal layer 181 and the backside metal layer 182 may be connected to a ground (GND) pattern included in a redistribution layer 142 of a connection member 140 to be used as a ground.

The connection member 140 may include a shielding structure 190 surrounding the redistribution layer 142. The redistribution layer 142 may be shielded from EMI by the shielding structure 190. The shielding structure 190 may be formed on an outer edge of the connection member 140, and in addition to a stack via illustrated in FIG. 15, a line via, a copper block, or the like may also be used. The shielding structure 190 may also be connected to the metal layer 181.

A degassing hole for dehydration or degassing may be formed in the backside metal layer 182. For this purpose, the backside metal layer 182 may also have a mesh shape.

A wall surface of a first through hole 110HA having a semiconductor chip 120 disposed therein may not be coated with a metal layer. For example, the wall surface of the first through hole 110HA may be in physical contact with the second encapsulant 132. The physical contact between the wall surface of the first through hole 110HA and the second encapsulant 132 may be achieved by first forming the second through hole 110HB and the third through hole 110HC, forming the metal layer 181 through plating, disposing the first passive component 125A and the second passive component 125B in the second through hole 110HB and the third through hole 110HC, respectively, forming the first through hole 110HA when no defect is detected, and disposing the semiconductor chip 120 therein. Alternately, the physical contact between the wall surface of the first through hole 110HA and the second encapsulant 132 may be achieved by forming the first through hole 110HA, the second through hole 110HB, and the third through hole 110HC, forming the metal layer 181 through plating while the first through hole 110HA is filled with a dry film or the like, disposing the first passive component 125A and the second passive component 125B in the second through hole 110HB and the third through hole 110HC, respectively, opening the first through hole 110HA when no defect is detected, and disposing the semiconductor chip 120 therein. In addition, various methods may be used. Surface mounting of the first passive component 125A and the second passive component 125B may be relatively easy. However, since a high degree of accuracy and a clean environment may be required for surface mounting of the semiconductor chip 120, the surface mounting of the semiconductor chip 120 may be relatively difficult. Therefore, when a process of mounting and encapsulating the first passive component 125A and the second passive component 125B and a process of mounting and encapsulating the semiconductor chip 120 are separately performed, influence on mounting yields, the effects of foreign substances, or the like, in both processes, may be significantly reduced. In particular, the relatively expensive semiconductor chip 120 may be mounted only on a separate good-quality unit by a precise process, subsequent to mounting the first passive component 125A and the second passive component 125B, thus having a high degree of yield.

Although not illustrated in FIG. 15, the cross-sectional view, other through holes, such as fourth to sixth through holes 110HD to 110HF, may further be formed, the metal layer 181 may be disposed on a wall surface of each of the fourth to sixth through holes 110HD to 110HF, and the metal layer 181 may be connected to the backside metal layer 182 by the backside via 183. Further, the metal layer 181 and the backside metal layer 182 may be connected to the ground (GND) pattern included in the redistribution layer 142 of the connection member 140 or the shielding structure 190. Therefore, the third to fifth passive components 125C to 125E disposed in the fourth to sixth through holes 110HD to 110HF may be surrounded by the metal layer 181 to provide the effects of EMI shielding and heat dissipation. Descriptions of elements or manufacturing methods overlapping previously provided descriptions thereof will be omitted.

Figure 16:
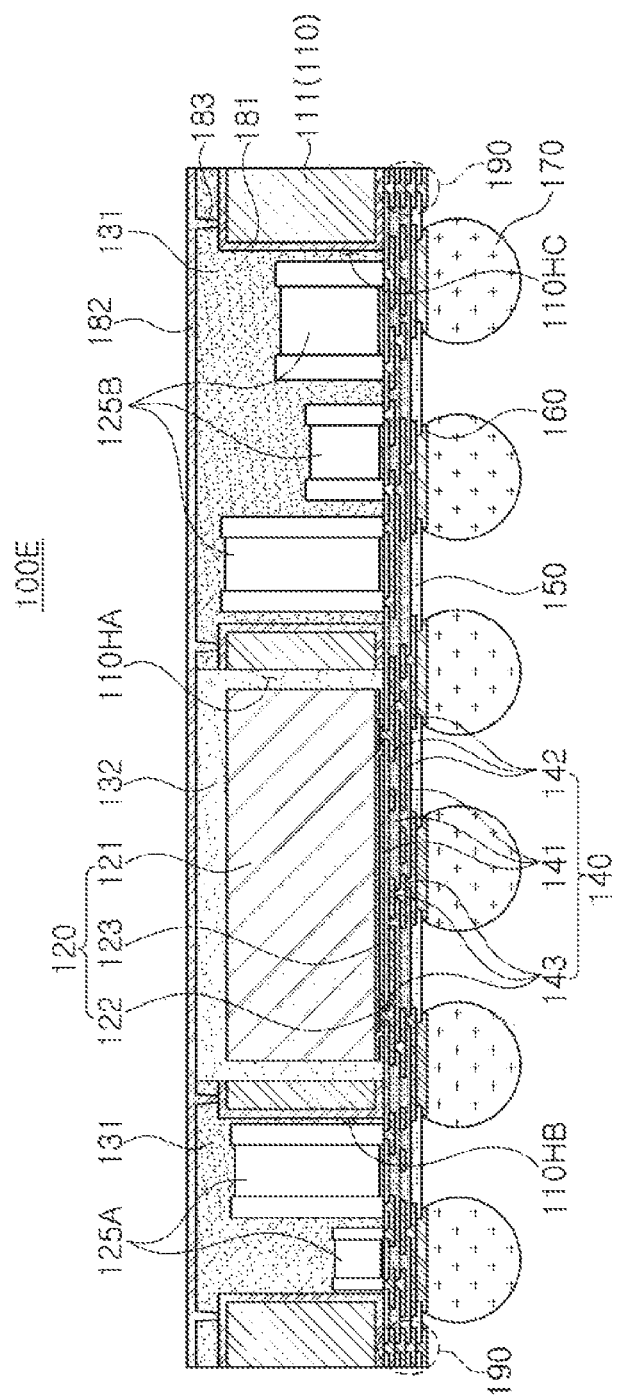
FIG. 16 is a schematic cross-sectional view illustrating another example of a fan-out semiconductor package module.

FIG. 16 is a schematic cross-sectional view illustrating another example of a fan-out semiconductor package module.

Referring to FIG. 16, a fan-out semiconductor package module 100E, according to another example, may further include a metal layer 181 and a backside metal layer 182 for EMI shielding and heat dissipation, and a backside via 183, in addition to the fan-out semiconductor package module 100B, according to another example, described above. The backside via 183 may not pass through a second encapsulant 132, and may pass through at least a portion of a first encapsulant 131. Descriptions of elements or manufacturing methods overlapping previously provided descriptions thereof will be omitted.

Figure 17:
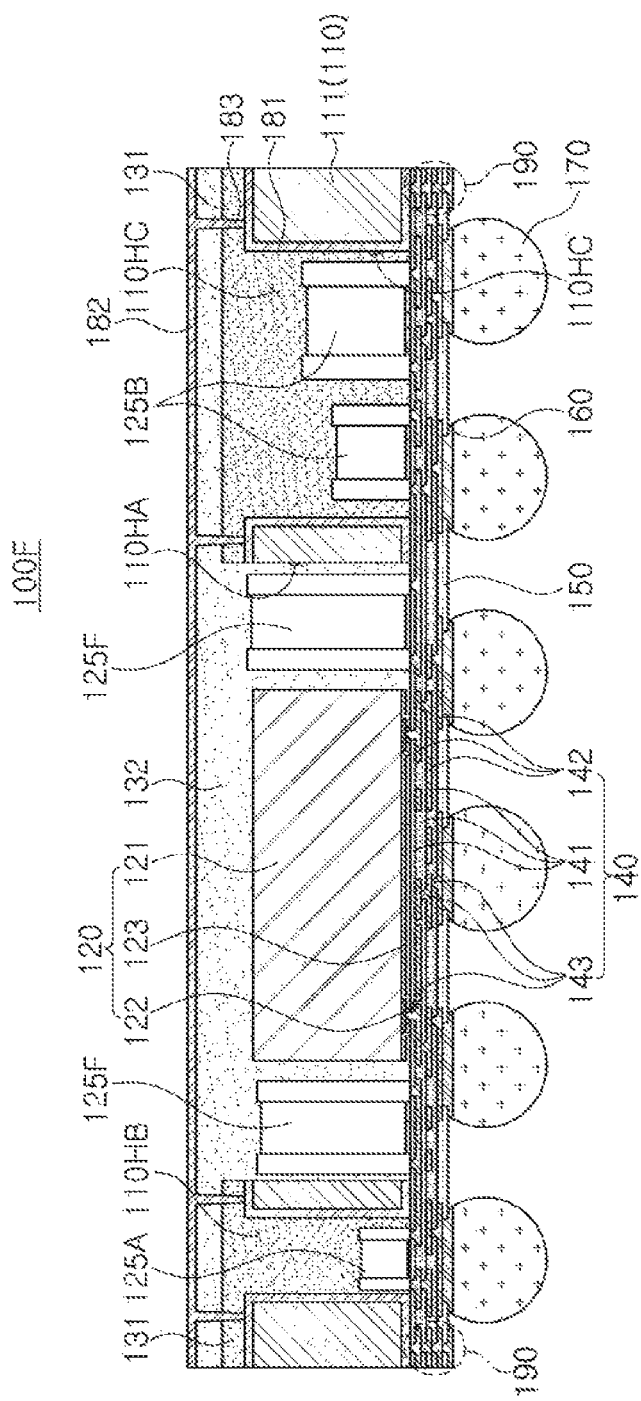
FIG. 17 is a schematic cross-sectional view illustrating another example of a fan-out semiconductor package module.

FIG. 17 is a schematic cross-sectional view illustrating another example of a fan-out semiconductor package module.

Referring to FIG. 17, a fan-out semiconductor package module 100F, according to another example, may further include a metal layer 181 and a backside metal layer 182 for EMI shielding and heat dissipation, and a backside via 183, in addition to the fan-out semiconductor package module 100C, according to another example, described above. Descriptions of elements or manufacturing methods overlapping previously provided descriptions thereof will be omitted.

Figure 18:
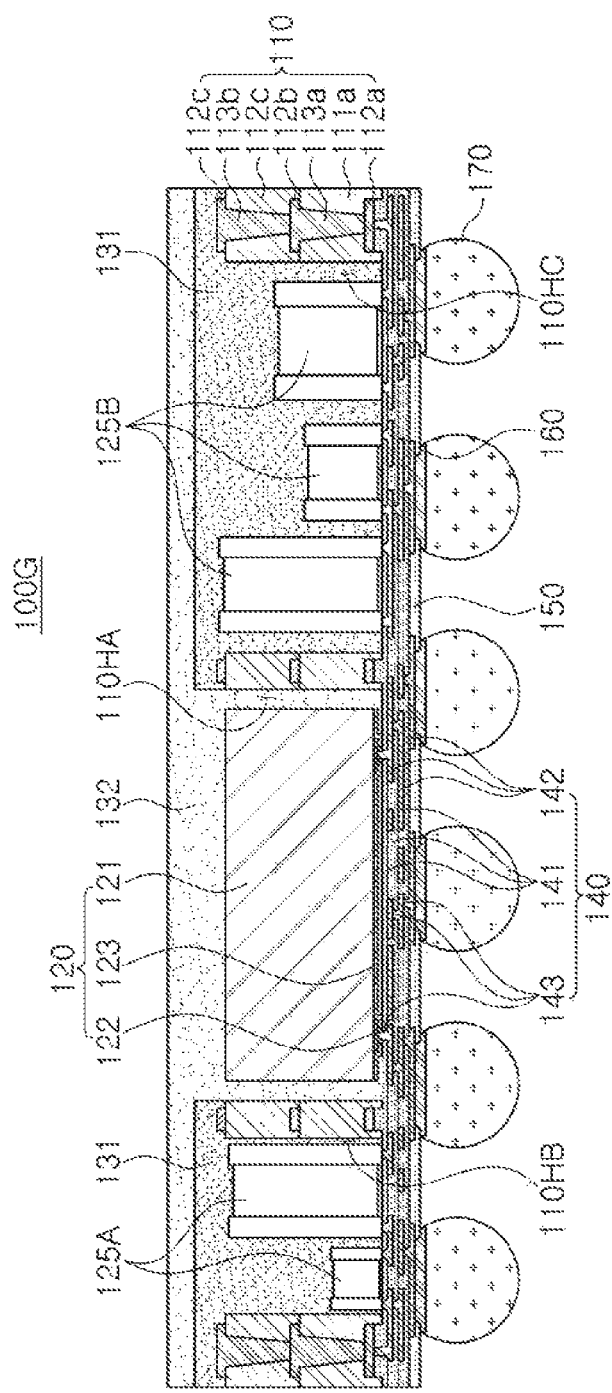
FIG. 18 is a schematic cross-sectional view illustrating another example of a fan-out semiconductor package module.

FIG. 18 is a schematic cross-sectional view illustrating another example of a fan-out semiconductor package module.

Referring to the FIG. 18, a fan-out semiconductor package module 100G, according to another example, may include a first insulating layer 111*a* in which a core member 110 may contact a connection member 140, a first wiring layer 112*a* contacting the connection member 140 and embedded in the first insulating layer 111*a*, a second wiring layer 112*b* opposite the first wiring layer 112*a* of the first insulating layer 111*a*, a second insulating layer 111*b* disposed on the first insulating layer 111*a* to cover the second wiring layer 112*b*, and a third wiring layer 112*c* disposed on the second wiring layer 112*b*, in addition to the fan-out semiconductor package module 100A, according to an example, described above. The first to third wiring layers 112*a* to 112*c* may be electrically connected to a connection pad 122. The first and second wiring layers 112*a* and 112*b* may be electrically connected to each other by a first via 113*a* passing through the first insulating layer 111*a*, and the second and third wiring layers 112*b* and 112*c* may be electrically connected to each other by a second via 113b passing through the second insulating layer 111b.

When the first wiring layer 112a is embedded in the first insulating layer 111a, a step portion generated by the thickness of the first wiring layer 112a may be significantly reduced, and thus an insulating distance of the connection member 140 may become constant. For example, a difference between a distance from a redistribution layer 142 of the connection member 140 to a lower surface of the first insulating layer 111a and a distance from the redistribution layer 142 of the connection member 140 to the connection pad 122 of a semiconductor chip 120 may be less than the thickness of the first wiring layer 112a. Therefore, a high-density wiring design of the connection member 140 may be facilitated.

The lower surface of the first wiring layer 112a of the core member 110 may be positioned above a lower surface of the connection pad 122 of the semiconductor chip 120. In addition, a distance between the redistribution layer 142 of the connection member 140 and the first wiring layer 112a of the core member 110 may be greater than that between the redistribution layer 142 of the connection member 140 and the connection pad 122 of the semiconductor chip 120. This is because the first wiring layer 112a may be recessed inwardly of the first insulating layer 111a. As described above, when the first wiring layer 112a, recessed inwardly of the first insulating layer 111a, causes the lower surface of the first insulating layer 111a and the lower surface of the first wiring layer 112a to be stepped from each other, the first wiring layer 112a may be prevented from being contaminated due to bleeding of a material of a first encapsulant 131. The second wiring layer 112b of the core member 110 may be positioned between an active surface and an inactive surface of the semiconductor chip 120. The core member 110 may have a thickness corresponding to that of the semiconductor chip 120, and thus the second wiring layer 112b, formed inside the core member 110, may be disposed on a level between the active surface and the inactive surface of the semiconductor chip 120.

The thicknesses of the first to third wiring layers 112a to 112c of the core member 110 may be greater than that of the redistribution layer 142 of the connection member 140. Since the core member 110 may have a thickness equal to or greater than that of the semiconductor chip 120, the first to third wiring layers 112a to 112c may have relatively larger sizes, depending on the scale of the core member 110. Conversely, the redistribution layer 142 of the connection member 140 may have a size less than those of the first to third wiring layers 112a to 112c, so as to be thinned.

A material of each of the first insulating layer 111a and the second insulating layer 111b is not particularly limited. For example, an insulating material may be used. The insulating material may be a thermosetting resin such as an epoxy resin, a thermoplastic resin such as polyimide, or a resin such as a prepreg, an ABF, FR-4, or BT, in which a core such as an inorganic filler, a glass fiber, a glass cloth, or a glass fabric is impregnated with the thermosetting resin and the thermoplastic resin. A PID resin may also be used.

The first to third wiring layers 112a to 112c may serve to redistribute the connection pad 122 of the semiconductor chip 120. A material of each of the first to third wiring layers 112a to 112c may be a conductive material, such as copper (Cu), aluminum (Al), silver (Ag), tin (Sn), gold (Au), nickel (Ni), lead (Pb), titanium (Ti), or any alloy thereof. The first to third wiring layers 112a to 112c may perform various functions, depending on designs thereof. For example, each of the first to third wiring layers 112a to 112c may include a ground (GND) pattern, a power (PWR) pattern, a signal (S) pattern, and the like. Here, the signal (S) pattern may include various signals, except for the ground (GND) pattern, the power (PWR) pattern, and the like, such as data signals, and the like. Further, the first to third wiring layers 112a to 112c may include a via pad, a wire pad, an electrical connection structure pad, or the like.

The first and second vias 113a and 113b may electrically connect the first to third wiring layers 112a to 112c formed on different layers, resulting in formation of an electrical path in the core member 110. A material of each of the first and second vias 113a and 113b may also be a conductive material. Each of the first and second vias 113a and 113b may be fully filled with the conductive material, or the conductive material may also be formed along a wall surface of the first or second via 113a or 113b. Further, the first and second vias 113a and 113b may have all shapes known in the related art, such as a tapered shape, a cylindrical shape, or the like. When a hole for the first via 113a is formed, a pad disposed on a portion of the first wiring layer 112a may serve as a stopper, and thus it may be advantageous that the first via 113a have a tapered shape having a width of an upper surface thereof greater than that of a lower surface thereof, in terms of a process. In this case, the first via 113a may be integrally formed with a pad pattern of the second wiring layer 112b. When a hole for the second via 113b is formed, a pad disposed on a portion of the second wiring layer 112b may serve as a stopper, and thus it may be advantageous that the second via 113b have a tapered shape having a width of an upper surface thereof greater than that of a lower surface thereof, in terms of a process. In this case, the second via 113b may be integrally formed with a pad pattern of the third wiring layer 112c.

The core member 110 of the fan-out semiconductor package module 100G, according to another example, may be used even in the fan-out semiconductor package module 100B, 100C, 100D, 100E, or 100F, according to another example.

Descriptions of configurations overlapping the previously described configuration will be omitted.

Figure 19:
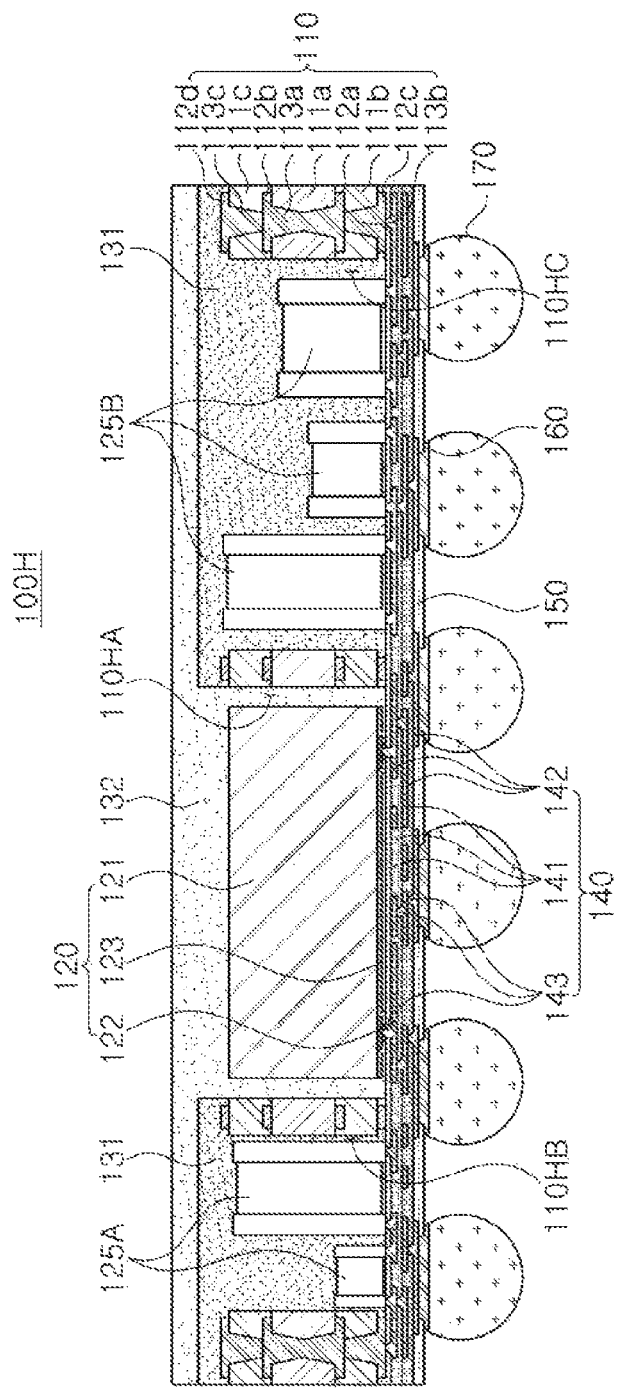
FIG. 19 is a schematic cross-sectional view illustrating another example of a fan-out semiconductor package module.

FIG. 19 is a schematic cross-sectional view illustrating another example of a fan-out semiconductor package module.

Referring to FIG. 19, in a fan-out semiconductor package 100H according to another example, a core member 110 may include a first insulating layer 111a, a first wiring layer 112a and a second wiring layer 112b disposed on opposite surfaces of the first insulating layer 111a, a second insulating layer 111b disposed on the first insulating layer 111a to cover the first wiring layer 112a, a third wiring layer 112c disposed on the second insulating layer 111b, a third insulating layer 111c disposed on the first insulating layer 111a to cover the second wiring layer 112b, and a fourth wiring layer 112d disposed on the third insulating layer 111c. The first to fourth wiring layers 112a to 112d may be electrically connected to a connection pad 122. The core member 110 may include a larger number of first to fourth wiring layers 112a to 112d, and thus a connection member 140 may further be simplified. Thus, degradation of yield due to a defect generated in a process of forming the connection member 140 may be alleviated. The first to fourth wiring layers 112a to 112d may be electrically connected to one another by first to third vias 113a to 113c passing through the first to third insulating layers 111a to 111c, respectively.

The first insulating layer 111a may have a thickness greater than those of the second insulating layer 111b and the third insulating layer 111c. Basically, the thickness of the first insulating layer 111a may be relatively increased to maintain the rigidity thereof, and the second and third insulating layers 111b and 111c may be employed to form larger numbers of third and fourth wiring layers 112c and 112d. The first insulating layer 111a may include an insulating material different from those of the second and third insulating layers 111b and 111c. For example, the first insulating layer 111a may be, for example, a prepreg including a core, a filler, and an insulating resin, and each of the second and third insulating layers 111b and 111c may be an ABF or PID including a filler and an insulating resin, but a material of each of the first to third insulating layers 111a to 111c is not limited thereto. Similarly, the first via 113a passing through the first insulating layer 111a may have a diameter greater than those of the second and third vias 113b and 113c passing through the second and third insulating layers 111b and 111c, respectively.

A lower surface of the third wiring layer 112c of the core member 110 may be positioned below a lower surface of the connection pad 122 of a semiconductor chip 120. Further, a distance between a redistribution layer 142 of the connection member 140 and the third wiring layer 112c of the core member 110 may be less than that between the redistribution layer 142 of the connection member 140 and the connection pad 122 of the semiconductor chip 120. This is because the third wiring layer 112c may be disposed on the second insulating layer 111b to protrude and a passivation layer having a reduced thickness may be further formed on the connection pad 122 of the semiconductor chip 120. The first and second wiring layers 112a and 112b of the core member 110 may be disposed between active and inactive surfaces of the semiconductor chip 120. The core member 110 may have a thickness corresponding to that of the semiconductor chip 120, and thus the first and second wiring layers 112a and 112b, formed inside the core member 110, may be disposed on levels between the active and inactive surfaces of the semiconductor chip 120.

The thicknesses of the first to fourth wiring layers 112a to 112d of the core member 110 may be greater than that of the redistribution layer 142 of the connection member 140. Since the core member 110 may have a thickness equal to or greater than that of the semiconductor chip 120, the first to fourth wiring layers 112a to 112d may also have relatively larger sizes. Conversely, the redistribution layer 142 of the connection member 140 may have a relatively reduced size, so as to be thinned.

The core member 110 of the fan-out semiconductor package module 100H, according to another example, described above, may be used even in the fan-out semiconductor package module 100B, 100C, 100D, 100E, or 100F, according to another example. Descriptions of configurations overlapping the previously described configuration will be omitted.

Figure 20:
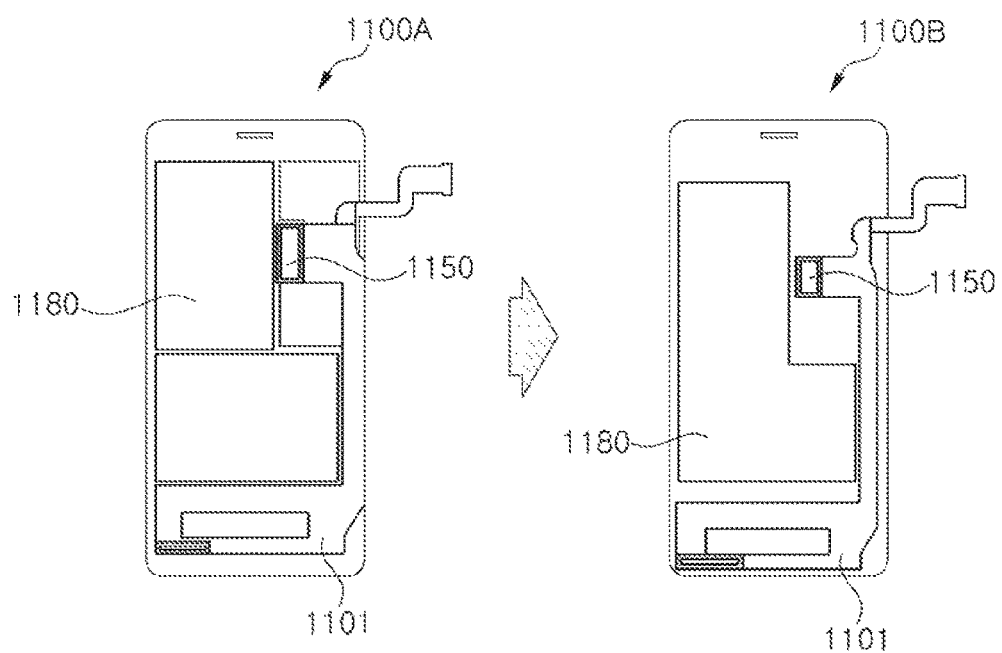
FIG. 20 shows schematic plan views illustrating effects obtained by using the fan-out semiconductor package module, according to an exemplary embodiment, in an electronic device.

FIG. 20 shows schematic plan views illustrating effects obtained by using the fan-out semiconductor package module, according to an exemplary embodiment, in an electronic device.

Referring to FIG. 20, as the size of a display for a mobile device 1100A or 1100B increases, a need for increased battery capacity has arisen. Because an area of a battery 1180 in the mobile device 1100A or 1100B increases according to an increase in battery capacity, a reduction in the size of a motherboard 1101 may be required. Accordingly, a mounting area for components may be reduced, and thus an area of a module 1150, including a PMIC and resulting passive components, may continue to decrease. When the fan-out semiconductor package module 100A, 100B, 100C, 100D, 100E, 100F, 100G, or 100H, according to an exemplary embodiment, is used in the electronic device, the size of the module 1150 may be significantly reduced. Thus, an area except for the module 1150 may be effectively used.

Figure 21:
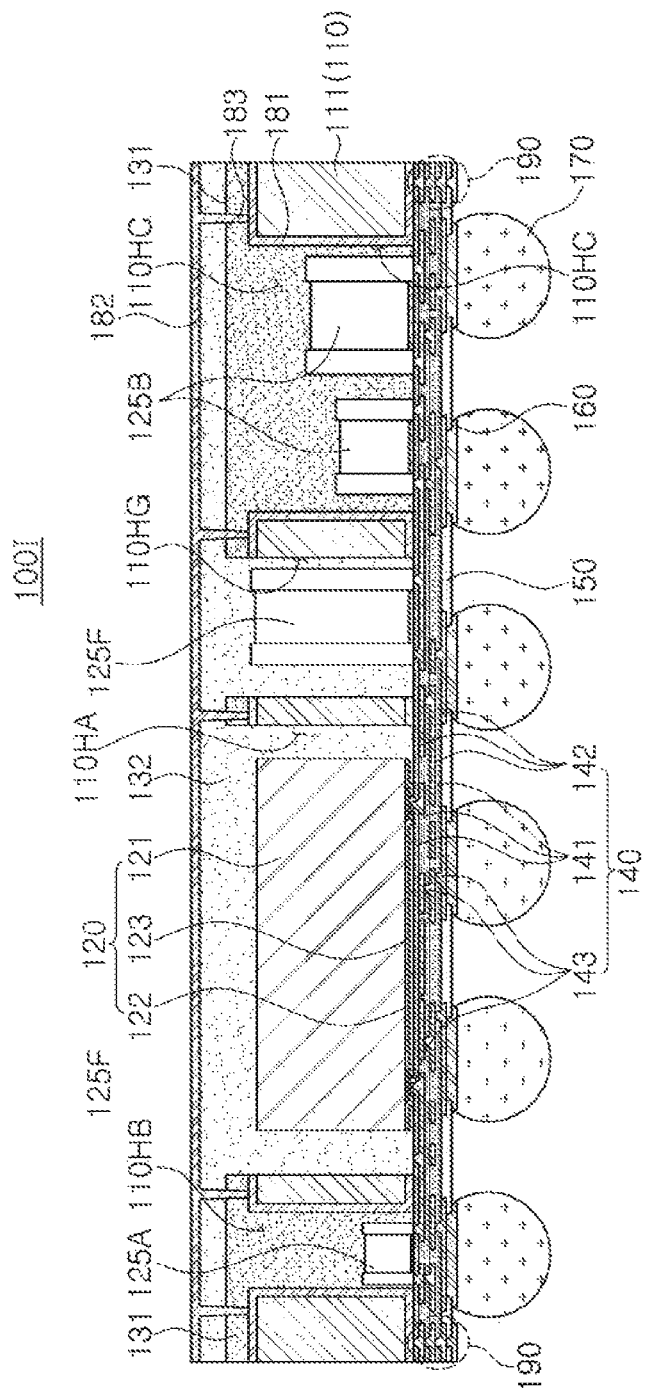
FIG. 21 is a schematic cross-sectional view illustrating another example of a fan-out semiconductor package module.

FIG. 21 is a schematic cross-sectional view illustrating another example of a fan-out semiconductor package module.

Referring to FIG. 21, in a fan-out semiconductor package module 100I, according to another example, a first passive component 125A and a second passive component 125B, each having a relatively reduced thickness, may be disposed in a second through hole 110HB and a third through hole 110HC, respectively, and a sixth passive component 125F, having a relatively increased thickness, may be disposed in a seventh through hole 110HG. Also, a second encapsulant 132 encapsulating at least a portion of the sixth passive component 125F. Since a first encapsulant 131 itself, encapsulating the first and second passive components 125A and 125B, each having a relatively reduced thickness, may have a reduced thickness, the thickness of the fan-out semiconductor package module 100I may be reduced, and problems caused by thickness variations may be solved more effectively. Although not illustrated in FIG. 21, the cross-sectional view, other through holes, such as fourth to sixth through holes 110HD to 110HF, may further be formed, and passive components, such as third to fifth passive components 125C to 125E, each having a relatively reduced thickness, may be disposed therein. Descriptions of elements or manufacturing methods overlapping previously provided descriptions thereof will be omitted.

As set forth above, according to an exemplary embodiment, there may be provided a fan-out semiconductor package module having a novel structure, which may significantly reduce mounting areas of a semiconductor chip and a plurality of passive components, may significantly reduce a length of an electrical path between the semiconductor chip and the passive component, may nonetheless solve the problem of production yield, and may obtain an improved electromagnetic interference (EMI) shielding and heat dissipation effect using plating or the like.

While exemplary embodiments have been shown and described above, it will be apparent to those skilled in the art that modifications and variations could be made without departing from the scope of the present disclosure, as defined by the appended claims.

What is claimed is:
1. A fan-out semiconductor package module comprising:
a core member having a first through hole and a second through hole spaced from each other;
a semiconductor chip disposed in the first through hole, the semiconductor chip having an active surface and an inactive surface opposite the active surface, the active surface having a connection pad disposed thereon;
at least one first passive component disposed in the second through hole;
a first encapsulant encapsulating at least a portion of each of the core member and the at least one first passive component, the first encapsulant filling at least a portion of the second through hole;
a second encapsulant encapsulating at least a portion of the inactive surface of the semiconductor chip, the second encapsulant filling at least a portion of the first through hole; and
a connection member disposed on the core member, the active surface of the semiconductor chip, and the at least one first passive component, the connection mem- ber including a redistribution layer electrically connected to the connection pad and the at least one first passive component.

2. The fan-out semiconductor package module of claim 1, further comprising: a metal layer disposed on a wall surface of the second through hole.

3. The fan-out semiconductor package module of claim 2, wherein a wall surface of the first through hole is in physical contact with the second encapsulant.

4. The fan-out semiconductor package module of claim 2, wherein the metal layer is connected to a ground included in the redistribution layer of the connection member.

5. The fan-out semiconductor package module of claim 2, wherein the metal layer extends to an upper surface and a lower surface of the core member.

6. The fan-out semiconductor package module of claim 5, further comprising:
a backside metal layer disposed on the first encapsulant or the second encapsulant; and
a backside via passing through at least a portion of the first encapsulant or the second encapsulant, the backside via connecting the metal layer to the backside metal layer.

7. The fan-out semiconductor package module of claim 5, wherein the connection member includes a shielding structure surrounding the redistribution layer.

8. The fan-out semiconductor package module of claim 7, wherein the shielding structure is connected to the metal layer.

9. The fan-out semiconductor package module of claim 1, wherein the second encapsulant covers an upper surface of the first encapsulant.

10. The fan-out semiconductor package module of claim 1, wherein respective upper surfaces of the first encapsulant and the second encapsulant are disposed on the same level.

11. The fan-out semiconductor package module of claim 1, wherein the semiconductor chip and the at least one first passive component are disposed in parallel with each other, and are electrically connected to each other through the redistribution layer of the connection member.

12. The fan-out semiconductor package module of claim 11, wherein the connection member further includes vias connecting the connection pad and the at least one first passive component to the redistribution layer of the connection member, and each of the connection pad and the at least one first passive component is in physical contact with the vias of the connection member.

13. The fan-out semiconductor package module of claim 1, wherein the semiconductor chip includes a power management integrated circuit (PMIC), and the at least one first passive component includes a capacitor.

14. The fan-out semiconductor package module of claim 1, wherein the core member further includes a third through hole spaced from the first through hole and from the second through hole, at least one second passive component is disposed in the third through hole, the first encapsulant encapsulates at least a portion of the at least one second passive component, and fills at least a portion of the third through hole, and the redistribution layer of the connection member is electrically connected to the at least one second passive component.

15. The fan-out semiconductor package module of claim 1, further comprising: at least one third passive component disposed in the first through hole,
wherein the second encapsulant encapsulates at least a portion of the at least one third passive component, the redistribution layer of the connection member is electrically connected to the at least one third passive component, and a thickness of the at least one third passive component is greater than a thickness of the at least one first passive component.

16. The fan-out semiconductor package module of claim 1, wherein the core member includes a wiring layer electrically connected to the connection pad and the at least one first passive component through the redistribution layer of the connection member.

17. The fan-out semiconductor package module of claim 16, wherein the core member includes a first insulating layer contacting the connection member, a first wiring layer contacting the connection member and embedded in the first insulating layer, and a second wiring layer disposed on a second surface of the first insulating layer opposite a first surface of the first insulating layer, in which the first wiring layer is embedded, wherein the first wiring layer and the second wiring layer are electrically connected to the connection pad.

18. The fan-out semiconductor package module of claim 17, wherein the core member further includes:
a second insulating layer disposed on the first insulating layer to cover the second wiring layer; and
a third wiring layer disposed on the second insulating layer, the third wiring layer being electrically connected to the connection pad.

19. The fan-out semiconductor package module of claim 1, wherein the core member includes a first insulating layer, and a first wiring layer and the second wiring layer disposed on opposite surfaces of the first insulating layer, the first wiring layer and the second wiring layer being electrically connected to the connection pad.

20. The fan-out semiconductor package module of claim 19, wherein the core member further includes:
a second insulating layer disposed on the first insulating layer to cover the first wiring layer;
a third wiring layer disposed on the second insulating layer;
a third insulating layer disposed on the first insulating layer to cover the second wiring layer; and
a fourth wiring layer disposed on the third insulating layer, the third wiring layer and the fourth wiring layer being electrically connected to the connection pad.

21. The fan-out semiconductor package module of claim 1, wherein the first encapsulant and the second encapsulant have an interface therebetween.

22. The fan-out semiconductor package module of claim 1, wherein the first encapsulant and the second encapsulant are made of different materials.

23. A semiconductor package module comprising:
a core member having a second through hole; a first passive component disposed in the second through hole;
a first encapsulant encapsulating at least a portion of each of the core member and the first passive component, the first encapsulant filling at least a portion of the second through hole;
a first through hole penetrating through the core member and the first encapsulant;
a semiconductor chip disposed in the first through hole, the semiconductor chip having an active surface and an inactive surface opposite the active surface, the active surface having a connection pad disposed thereon;
a second encapsulant encapsulating at least a portion of the inactive surface of the semiconductor chip, the second encapsulant filling at least a portion of the first through hole; and a connection member disposed on the core member, the active surface of the semiconductor chip, and the at least one first passive component, the connection member including a redistribution layer electrically connected to the connection pad and the at least one first passive component.

24. The semiconductor package module of claim 23, further comprising a metal layer disposed on a wall surface of the second through hole.

25. The semiconductor package module of claim 23, further comprising:
- a metal layer disposed on the core member and extending to a wall surface of the second through hole;
- a backside metal layer disposed on the first encapsulant or the second encapsulant; and
- a backside via passing through at least a portion of the first encapsulant or the second encapsulant, the backside via connecting the metal layer to the backside metal layer.

26. The semiconductor package module of claim 23, wherein the connection member includes a shielding structure surrounding the redistribution layer.

27. The semiconductor package module of claim 23, wherein respective upper surfaces of the first encapsulant and the second encapsulant are disposed on the same level.

28. The semiconductor package module of claim 23, wherein the second encapsulant covers the first encapsulant.

29. The semiconductor package module of claim 23, further comprising a second passive component disposed in the first through hole,
wherein an upper surface of the second passive component is above an upper surface of the first passive component with respect to the connection member.

30. The semiconductor package module of claim 23, wherein the core member includes one or more wiring layers electrically connected to the connection pad and the first passive component through the redistribution layer of the connection member.

\* \* \* \* \*